United States Patent [19]

Smothers et al.

[11] Patent Number: 5,147,758
[45] Date of Patent: Sep. 15, 1992

[54] RED SENSITIVE PHOTOPOLYMERIZABLE COMPOSITIONS

[75] Inventors: William K. Smothers, Hockessin, Del.; Gregory C. Weed, Towanda, Pa.; Evan D. Laganis, Wilmington, Del.; George Lalka, Lindenwold, N.J.

[73] Assignee: E. I. Du Pont de Nemours and Company, Wilmington, Del.

[21] Appl. No.: 657,736

[22] Filed: Feb. 19, 1991

[51] Int. Cl.$^5$ ............... G03F 7/032; G03F 7/031; G03F 7/029
[52] U.S. Cl. ............................ 430/281; 430/723; 430/914; 430/2; 522/25; 522/26
[58] Field of Search .............. 430/281, 923, 914, 2; 522/31, 25, 26

[56] References Cited

U.S. PATENT DOCUMENTS

| | | | |
|---|---|---|---|
| 4,772,541 | 9/1988 | Gottschalk et al. | 430/339 |
| 4,937,161 | 6/1990 | Kita et al. | 430/281 |
| 4,950,581 | 8/1990 | Koike et al. | 430/281 |
| 4,971,891 | 11/1990 | Kawamura et al. | 430/281 |
| 4,997,745 | 5/1991 | Kawamura et al. | 430/281 |
| 5,055,372 | 10/1991 | Shanklin et al. | 430/281 |

FOREIGN PATENT DOCUMENTS

| | | |
|---|---|---|
| 369345 | 2/1989 | European Pat. Off. . |
| 379200 | 1/1990 | European Pat. Off. . |
| 3926666A1 | 8/1989 | Fed. Rep. of Germany . |

OTHER PUBLICATIONS

S. Chatterjee et al., Electron Transfer Reactions in Cyanine-Borate Ions Pairs: Photopolymerization Initiators Sensitive to Visible Light, SPSE Proc., 42nd Annual Conference, SPSE, Springfield, Va., 1989, pp. 388 to 391.

Primary Examiner—Marion E. McCamish
Assistant Examiner—Christopher D. RoDee

[57] ABSTRACT

Photopolymerizable compositions which comprise a borate anion, a squarylium sensitizer, and, in the preferred case, a halomethyl triazine are disclosed.

42 Claims, No Drawings

RED SENSITIVE PHOTOPOLYMERIZABLE COMPOSITIONS

FIELD OF THE INVENTION

This invention relates to photopolymerizable compositions containing initiator systems that absorb in the longer wavelength region of the visible spectrum. More particularly, this invention pertains to photopolymerizable compositions which comprise a borate anion, a squarylium sensitizer, and, in the preferred case, a halomethyl triazine.

BACKGROUND OF THE INVENTION

The use of photoinitiator systems to initiate photopolymerization is well known. When irradiated by actinic radiation, the photoinitiator system generates free radicals, which initiate polymerization of the monomer or monomers. The photoinitiator system may be a single compound which absorbs actinic radiation and forms the initiating radicals, or it may consist of several different materials which undergo a complex series of reactions to produce radicals. Added components, which do not absorb actinic radiation, but which increase the efficiency of the photoinitiator system, are known as coinitiators.

Many of the well-known photoinitiator systems limit the applicability of photopolymerizable compositions because they are activated only by ultraviolet radiation. The availability of reliable, relatively inexpensive, computer controlled visible lasers, which can expose the photopolymer directly, eliminating the intermediate photomask, has made it essential that initiator systems which can be activated by visible radiation be developed.

Applications for photopolymerizable compositions which are sensitive to visible radiation include: graphic arts films, proofing, printing plates, photoresists, and solder masks. The preparation of holograms in photopolymerizable compositions, such as are disclosed in Haugh, U.S. Pat. No. 3,658,526; Keys, U.S. Pat. No. 4,942,102; Monroe, U.S. Pat. No. 4,942,112; Smothers, U.S. Pat. No. 4,959,284; and Trout, U.S. Pat. No. 4,963,471, also require initiator systems which can be activated by visible radiation.

A large number of free-radical generating systems have been used as visible sensitizers for photopolymerizable compositions. Photoreducible dyes and with various coinitiators have been widely studied. A useful discussion of dye sensitized photopolymerization can be found in "Dye Sensitized Photopolymerization" by D. F. Eaton in Adv. in Photochemistry, Vol. 13, D. H. Volman, G. S. Hammond, and K. Gollinick, eds., Wiley-Interscience, New York, 1986, pp 427–487. Many dye sensitized systems undergo dark reactions and are not shelf stable.

Shelf stable initiator systems containing borate anion coinitiators have been disclosed in Gottschalk, U.S. Pat. Nos. 4,772,530 and 4,772,541. The photopolymerizable compositions contained a cationic dye-borate anion complex which is capable of absorbing actinic radiation and producing free radicals. Cationic methine, polymethine, triarylmethane, indoline, thiazine, xanthene, oxazine, and acridine dyes were disclosed. Triaryl alkyl borate anions were the preferred borate coinitiators. Additional photopolymerizable compositions containing a salt formed by an organic cationic dye compound and a borate anion are disclosed in Yamaguchi, U.S. Pat. Nos. 4,902,604 and 4,952,480. Initiator systems containing a transition metal complex and a borate ion are disclosed in Adair, U.S. Pat. No. 4,954,414.

Koike, U.S. Pat. No. 4,950,581, discloses photopolymerizable compositions containing an organic dye and a triaryl butyl borate anion coinitiator. In these systems the dye was non-ionic. Merocyanine type dyes, coumarin type dyes, and xanthene and thioxanthene dyes were disclosed.

Initiator systems comprising a squarylium dye and a halomethyl triazine are disclosed in Nagasaka, EPO Application 90/101,025. These systems were sensitive to light having a wavelength of 650 nm.

Despite the advances which have been made, there is a continuing need for improved initiator systems with high sensitivity to the red region of the visible spectrum.

SUMMARY OF THE INVENTION

In one embodiment this invention is a photopolymerizable composition comprising:

(A) an ethylenically unsaturated monomer; and
(B) an initiator system, said initiator system comprising:
(1) a squarylium compound selected from the group consisting of:

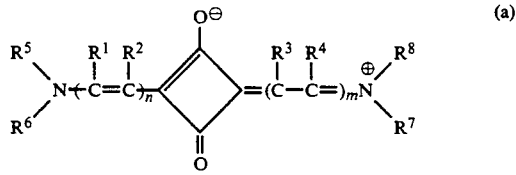

wherein:

$R^1$, $R^2$, $R^3$, and $R^4$ are each independently hydrogen, hydroxyl, halogen, substituted or unsubstituted alkyl of one to six carbon atoms, or substituted or unsubstituted aryl or heteroaryl group having from 5 to 10 atoms;

$R^5 R^6$, $R^7$, and $R^8$ are each independently hydrogen, a substituted or unsubstituted alkyl or cycloalkyl group having from 1 to 6 carbon atoms or a substituted or unsubstituted aryl or heteroaryl group having from 5 to 10 atoms;

or any of $R^1$, $R^2$, $R^3$, and $R^4$ groups are combined with any of $R^5$, $R^6$, $R^7$, and $R^8$ and/or with each other to a form a 5- to 7-membered substituted or unsubstituted carbocyclic or heterocyclic ring;

or any of $R^5$, $R^6$, $R^7$, and $R^8$ are joined together to form a 5-to 7-membered substituted or unsubstituted nitrogen-containing heterocyclic ring; and n and m are each independently 1 to 3; and

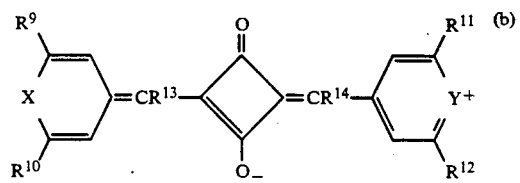

wherein

X and Y are each independently oxygen or sulfur and $R^9$, $R^{10}$, $R^{11}$, $R^{12}$, $R^{13}$, and $R^{14}$ are each independently hydrogen or an alkyl group having from one to eight carbon atoms; and (2) a borate anion coinitiator represented by the formula:

(BZ$^1$Z$^2$Z$^3$Z$^4$)— wherein

Z$^1$, Z$^2$, Z$^3$, and Z$^4$, the same or different, are selected from the group consisting of alkyl, aryl, aralkyl, alkenyl, alkynyl, alicyclic, heterocyclic, and allyl groups, with the proviso that at least one of Z$^1$, Z$^2$, Z$^3$, and Z$^4$ is not aryl. In a preferred embodiment the initiator system also comprises an s-triazine comprising at least one halogenated methyl group. In a more preferred embodiment the composition also comprises a polymeric binder.

In another embodiment this invention is a process for forming a hologram comprising exposing to modulated actinic radiation comprising an object beam and a reference beam bearing holographic information a photopolymerizable layer comprising:

(A) an ethylenically unsaturated monomer;
(B) a binder; and
(C) an initiator system, said initiator system comprising:

(1) a squarylium compound selected from the group consisting of:

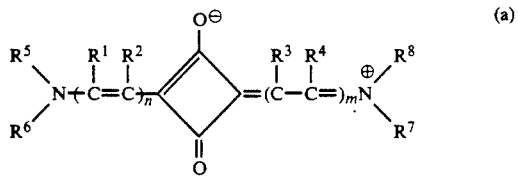
(a)

wherein:

R$^1$, R$_2$, R$^3$, and R$^4$ are each independently hydrogen, hydroxyl, halogen, substituted or unsubstituted alkyl of one to six carbon atoms, or substituted or unsubstituted aryl or heteroaryl group having from 5 to 10 atoms;

R$^5$, R$^6$, R$^7$, and R$^8$ are each independently hydrogen, a substituted or unsubstituted alkyl or cycloalkyl group having from 1 to 6 carbon atoms or a substituted or unsubstituted aryl or heteroaryl group having from 5 to 10 atoms;

or any of R$^1$, R$^2$, R$^3$, and R$^4$ groups are combined with any of R$^5$, R$^6$, R$^7$, and R$^8$ and/or with each other to a form a 5- to 7-membered substituted or unsubstituted carbocyclic or heterocyclic ring;

or any of R$^5$, R$^6$, R$^7$, and R$^8$ are joined together to form a 5- to 7-membered substituted or unsubstituted nitrogen-containing heterocyclic ring; and n and m are each independently 1 to 3; and

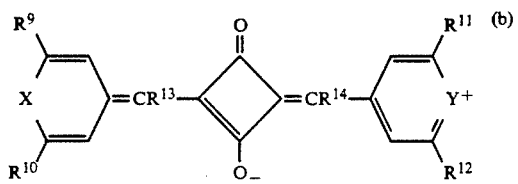
(b)

wherein

X and Y are each independently oxygen or sulfur and R$^9$, R$^{10}$, R$^{11}$, R$^{12}$, R$^{13}$, and R$^{14}$ are each independently hydrogen or an alkyl group having from one to eight carbon atoms;

(2) a borate anion coinitiator represented by the formula:

(BZ$^1$Z$^2$Z$^3$Z$^4$)— wherein

Z$^1$, Z$^2$, Z$^3$, and Z$^4$, the same or different, are selected from the group consisting of alkyl, aryl, aralkyl, alkenyl, alkynyl, alicyclic, heterocyclic, and allyl groups, with the proviso that at least one of Z$^1$, Z$^2$, Z$^3$, and Z$^4$ is not aryl; and (3) an s-triazine comprising at least one halogenated methyl group.

In a more preferred embodiment either the monomer or the binder contains a substituent selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moiety having up to three rings; (2) chlorine; (3) bromine; and (4) mixtures thereof; and the other component is substantially free of said substituent. In another preferred embodiment the hologram is fixed by a second, overall exposure to actinic radiation. In a still more preferred embodiment: the hologram is a reflection hologram; the monomer contains the selected substituent; the binder is (1) poly(vinyl butyral), (2) poly(vinyl acetate), or (3) a copolymer of vinyl acetate with tetrafluoroethylene and/or hexafluoropropylene containing 3 to 25% by weight fluorine.

DETAILED DESCRIPTION OF THE INVENTION

Photopolymerizable Compositions

The novel compositions of this invention are photopolymerizable compositions in which polymerization is initiated by free radicals generated by actinic radiation. These compositions comprise: a polymerizable monomer; an initiator system comprising a squarylium compound, a borate anion, and, optionally, an (alpha-halo)alkyl triazine; and, optionally, a binder. The composition may also comprise other ingredients which are conventional components of photopolymerizable systems, such as stabilizers, antihalation agents, coating aids, and the like.

Squarylium Compound

Squarylium compounds are selected from the group consisting of:

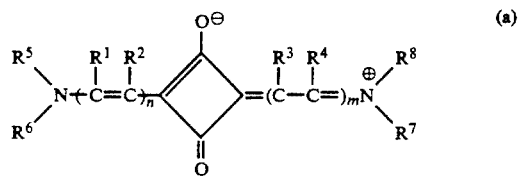
(a)

wherein:

R$^1$, R$^2$, R$^3$, and R$^4$ are each independently hydrogen, hydroxyl, halogen, or alkyl of one to six carbon atoms, substituted or unsubstituted aryl, or heteroaryl group having 5 to 10 carbon atoms;

R$^5$, R$^6$, R$^7$, and R$^8$ are each independently hydrogen, a substituted or unsubstituted alkyl or cycloalkyl group having from 1 to 6 carbon atoms or a substituted or unsubstituted aryl or heteroaryl group having from 5 to 10 atoms;

or any of $R^1$, $R^2$, $R^3$, and $R^4$ groups are combined with any of $R^5$, $R^6$, $R^7$, and $R^8$ and/or with each other to a form a 5- to 7-membered substituted or unsubstituted carbocyclic or heterocyclic ring;

or any of $R^5$, $R^6$, $R^7$, and $R^8$ are joined together to form a 5- to 7-membered substituted or unsubstituted nitrogen-containing heterocyclic ring; and n and m are each independently 1 to 3; and

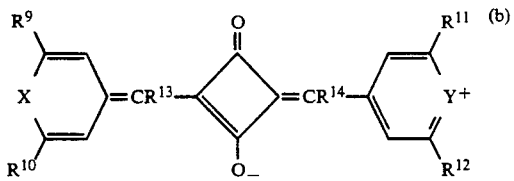 (b)

wherein

X and Y are each independently oxygen or sulfur and $R^9$, $R^{10}$, $R^{11}$, $R^{12}$, $R^{13}$, and $R^{14}$ are each independently alkyl groups from one to eight carbon atoms. $R^1$, $R^2$, $R^3$, and $R^4$ are each independently hydrogen; hydroxyl; halogen; alkyl of one to six carbon atoms, such as, for example, methyl, ethyl, n-propyl, iso-bornyl; or a substituted or unsubstituted aryl or heteroaryl group. Aryl groups and heteroaryl groups of five to ten atoms, such as, for example, phenyl, naphthyl, pyridinyl, furanyl, thiophenyl, etc., may be used.

Wherein substitution is possible, any of the groups present in the sensitizer may be substituted by any of the well known substituents, such as, for example, alkyl, alkoxy, halogen, cyano, sufonyl, amino, alkyl amino, dialkylamino, etc., provided the presence of the substituent does not adversely affect the properties of the sensitizer required for the operation of the initiator system, such as, for example, solubility, reactivity, and electronic properties, such as, for example, absorption spectrum.

A preferred group of squarylium compounds is represented by:

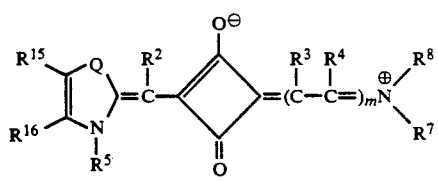

wherein:

$R^2$ is hydrogen or substituted or unsubstituted alkyl;

$R^5$ is (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

Q is O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl;

$R^{15}$ and $R^{16}$ are joined together to form a 5- to 7-membered substituted or unsubstituted carbocyclic or heterocyclic ring; and m is 1 or 2.

A more preferred group of squarylium compounds is represented by:

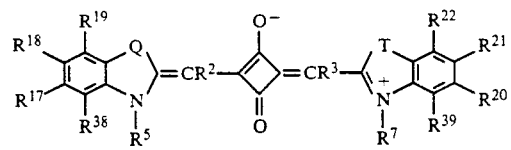

wherein $R^2$ and $R^3$ are each independently hydrogen or substituted or unsubstituted alkyl;

$R^5$ and $R^7$ are each independently (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

or $R^3$ and $R^7$ are joined together to form a 5- to 7-membered substituted or unsubstituted carbocyclic ring;

Q and T are each independently O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl;

$R^{17}$, $R^{18}$, $R^{19}$, $R^{20}$, $R^{21}$, $R^{22}$, $R^{38}$, and $R^{39}$ are each independently hydrogen, halogen, dialkylamino, substituted or unsubstituted phenyl, substituted or unsubstituted alkyl, alkoxyl, or cycloalkyl having from 1 to 6 carbon atoms;

or ($R^{38}$ and $R^{17}$), ($R^{17}$ and $R^{18}$), or ($R^{18}$ and $R^{19}$) are joined in a substituted or unsubstituted aromatic ring containing 5 to 7 atoms; and, independently, ($R^{39}$ and $R^{20}$), ($R^{20}$ and $R^{21}$), or ($R^{21}$ and $R^{22}$) are joined in a substituted or unsubstituted aromatic ring containing 5 to 7 atoms.

In a yet more preferred group of squarylium compounds, Q and T are the same and equal to $CR^{41}R^{42}$. In an even yet more preferred group of squarylium compounds, $R^{41}$ and $R^{42}$ are the same and equal to methyl, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl. Preferred members of this group are Sensitizers S-1, S-2, S-4, and S-5. A particularly preferred sensitizer is Sensitizer S-1. In another even yet more preferred group of squarylium compounds, $R^{42}$ and $R^{42}$ are the same and equal to methyl, $R^{17}$, $R^{20}$, $R^{38}$, and $R^{39}$ are the same and equal to hydrogen, ($R^{18}$ and $R^{19}$) and ($R^{21}$ and $R^{22}$) are each joined in an unsubstituted carbocyclic aromatic ring containing 6 atoms; and $R^5$ and $R^7$ are each equal to methyl or ethyl. A preferred member of this group is Sensitizer S-6.

In still another even more preferred group of squarylium compounds, $R^{41}$ and $R^{42}$ are the same and equal to methyl, ($R^2$ and $R^5$) and ($R^3$ and $R^7$) are each combined to form a six membered heterocyclic ring; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl. A preferred member of this group is Sensitizer S-3.

In another yet more preferred group of squarylium compounds, Q and T are the same and equal to S or Se, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl. Preferred members of this group are Sensitizers S-10 and S-11.

Another preferred group of squarylium compounds is represented by:

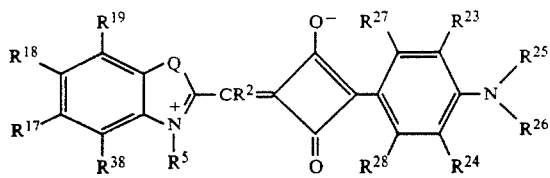

wherein $R^2$ is hydrogen or substituted or unsubstituted alkyl;

$R^5$ is (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

Q is O, S, Se, $NR^{40}$, or $CR^{41}R^{42}$, where $R^{40}$, $R^{41}$, and $R^{42}$ are each independently alkyl of about 1 to about 6 carbon atoms or substituted or unsubstituted phenyl;

$R^{17}$, $R^{18}$, $R^{19}$, and $R^{38}$ are each independently hydrogen, halogen, dialkylamino, substituted or unsubstituted phenyl, substituted or unsubstituted alkyl, alkoxyl, or cycloalkyl having from 1 to 6 carbon atoms;

or ($R^{38}$ and $R^{17}$), ($R^{17}$ and $R^{18}$), or ($R^{18}$ and $R^{19}$) are joined in a substituted or unsubstituted aromatic ring containing 5 to 7 atoms;

$R^{23}$, $R^{24}$, $R^{25}$, and $R^{26}$, are each independently hydrogen or alkyl of 1 to 6 carbon atoms, substituted or unsubstituted carbocyclic or heterocyclic ring;

or $R^{25}$ and $R^{26}$ are joined together to form a 5- to 7-membered heterocyclic ring;

or $R^{23}$ and $R^{25}$ are joined together to form a 5- or 6-membered heterocyclic ring and independently $R^{24}$ and $R^{26}$ are joined together to form a 6-membered heterocyclic ring, and $R^{27}$ and $R^{28}$ are independently hydrogen, hydroxyl, or alkyl, alkyoxyl, or cycloalkyl from 1 to 6 carbon atoms.

In a more preferred group $R^2$, $R^{17}$, $R^{18}$, $R^{19}$, $R^{27}$, $R^{28}$, and $R^{38}$ are each hydrogen. In a still more preferred group Q is $C(CH_3)_2$; $R^5$, $R^{25}$, and $R^{26}$ are independently methyl or ethyl; and $R^{23}$ and $R^{24}$ are each hydrogen. A preferred compound of this group is Sensitizer S-7.

Another preferred group of squarylium compounds is represented by:

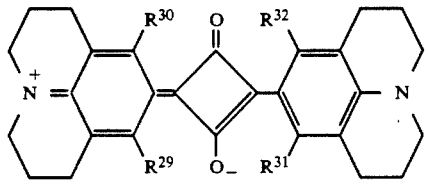

wherein $R^{29}$, $R^{30}$, $R^{31}$, and $R^{32}$ are independently hydrogen, hydroxyl, or alkyl or alkoxyl of 1 to 6 carbon atoms.

Preferred compounds are S-8, in which $R^{29}$, $R^{30}$, $R^{31}$, and $R^{32}$ are hydrogen, and S-9, in which $R^{29}$ and $R^{31}$ are hydrogen and $R^{30}$ and $R^{32}$ are hydroxyl.

Another preferred group of squarylium compounds is represented by:

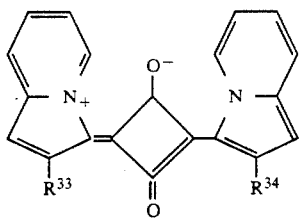

wherein $R^{33}$ and $R^{34}$ are each independently hydrogen, halogen, substituted or unsubstituted, alkyl, alkoxyl, or substituted or unsubstituted aryl or heteroaryl group having from 5 to 10 atoms.

Preferred compounds are those in which $R^{33}$ and $R^{34}$ are hydrogen, alkyl, or substituted or unsubstituted aryl or heteroaryl group having from 5 to 6 atoms. More preferred compounds are S-12, in which $R^{33}$ and $R^{34}$ are methyl, and S-13, in which $R^{33}$ and $R^{34}$ are p-methophenyl.

Another preferred group of squarylium compounds is: represented by:

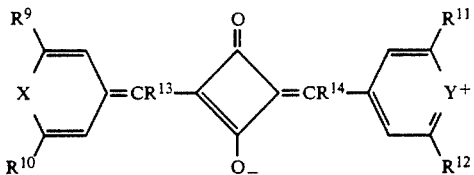

wherein

X and Y are each independently oxygen or sulfur and $R^9$, $R^{10}$, $R^{11}R^{12}$, $R^{13}$, and $R^{14}$ are each independently hydrogen or an alkyl group having from one to eight carbon atoms.

Preferred compounds are S-14, in which $R^9$, $R^{10}$, $R^{11}$, and $R^{12}$ are each t-butyl, $R^{13}$ and $R^{14}$ are hydrogen, and X and Y are oxygen, and S-15, in which $R^9$, $R^{10}$, $R^{11}$, and $R^{12}$ are each t-butyl, $R^{13}$ and $R^{14}$ are hydrogen and X and Y are sulfur.

Borate Anion

Borate anions useful as coinitiators with dyes are disclosed in Gottschalk, U.S. Pat. Nos. 4,772,530 and 4,772,541 and Koike, U.S. Pat. No. 4,950,581. The borate anions are represented by the following general formula:

$B(Z^1Z^2Z^3Z^4)^-$ 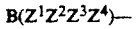

where $Z^1$, $Z^2$, $Z^3$, and $Z^4$, are independently selected from the group consisting of alkyl, aryl, aralkyl, alkenyl, alkynyl, heterocyclic, and allyl groups, with the proviso that at least one of $Z^1$, $Z^2$, $Z^3$, and $Z^4$, is not aryl.

Each group may contain up to twenty carbon atoms, but groups with about seven carbon atoms or less are preferred. The alkyl groups may be linear, branched or cyclic, and may be substituted or unsubstituted. Representative alkyl groups which may be present are, for example: methyl, ethyl, n-propyl, i-butyl, sec-butyl, n-butyl, n-pentyl, etc. Representative cyclic alkyl groups include cyclobutyl, cyclopentyl, and cyclohexyl.

Representative examples of aralkyl groups are benzyl and benzyl substituted with such groups as, for example, alkyl, alkoxyl, halo, cyano, and other conventional aromatic substituents. Representative examples of aryl groups include phenyl and naphthyl, which may be unsubstituted or substituted with groups such as, for example, alkyl, alkoxyl, halo, cyano, and other conventional aromatic substituents. Representative alkenyl groups are propenyl and ethynyl. Examples of heterocyclic groups include, for example, 3-thiophenyl, 4-pyridinyl, and 3-thiophenyl substituted with conventional aromatic substituents.

Preferably, at least one, but not more than three, of $Z^1$, $Z^2$, $Z^3$, and $Z^4$ is an aryl group. More preferred are anions in which $Z^1$–$Z^4$ is a combination of three aryl groups and one alkyl group. The phenyl and p-methoxyphenyl groups are preferred aryl groups. A preferred group of anions are the triphenylalkyl borate anions. A preferred anion is triphenylbutyl borate.

It is preferred that the cation associated with the borate anion not absorb a significant amount of actinic radiation since this would decrease photospeed. Representative cations are alkali metal cations and quaternary ammonium cations.

Quaternary ammonium cations containing four alkyl groups are preferred. The alkyl groups may be linear, branched or cyclic, and may be substituted or unsubstituted. Representative quaternary ammonium cations are tetramethyl ammonium, tetraethyl ammonium, tetrabutyl ammonium, benzyl trimethyl ammonium, benzyl dimethyl tetradecylammonium, and (2-hydroxyethyl)-trimethyl ammonium or choline cation.

Cations with larger alkyl groups may be used to advantage since the solubility of the borate salt in the coating solvent is generally increased. Cations in which the alkyl groups together contain up to a total about thirty carbon atoms are preferred. Hydroxyl substitution may improve solubility and/or photospeed. Particularly preferred cations are (2-hydroxyethyl)trimethyl ammonium and benzyldimethyltetradecyl ammonium.

Triazine

In a preferred embodiment the initiator system also comprises an s-triazine comprising at least one halogenated methyl group. Examples of triazines are given in Nagasaka, EPO Application 90/101,025 and in Bonham, U.S. Pat. No. 3,987,037, and Koike, U.S. Pat. Nos. 4,810,618 and 4,950,581 as well as in the literature references cited below. These s-triazines are represented by the following structure:

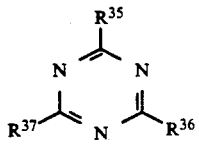

wherein $R^{35}$, $R^{36}$, and $R^{37}$, which may be the same or different, each represent a hydrogen, an alkyl group, a substituted alkyl group, an aryl group, a substituted aryl group, an aralkyl group, an amino group, a substituted amino group, or an alkoxyl group, with the proviso that at least one of these substituents is a mono-, di-, or trihalogen-substituted methyl group. Examples of the mono-, di-, and tri-halogen-substituted methyl group include: chloromethyl, bromomethyl, iodomethyl, dichloromethyl, dibromomethyl, diiodomethyl, trichloromethyl, tribromomethyl, and triiodomethyl.

More preferred triazines are those which contain at least one dichloromethyl or trichloromethyl group. Examples of preferred triazines include those represented by structures T-1 to T-9. The most preferred triazines contain at least one trichloromethyl group. The most preferred triazine is Triazine T-1, 2,4,6-tris(-trichloromethyl)-1,3,5-triazine.

Monomer/Binder

The composition contains at least one ethylenically unsaturated compound which undergoes free-radical initiated polymerization, generally known as a monomer. The composition contains at least one such material and may contain a mixture of such materials. In general, preferred monomers for photopolymer applications have boiling points greater than 100° C., more preferably, greater than 150° C.

Typical monomers are: unsaturated esters of alcohols, preferably polyols, such as, diethylene glycol diacrylate, glycerol triacrylate, ethylene glycol dimethacrylate, pentaerythritol tri- and tetraacrylate and methacrylate; unsaturated amides, such 1,6-hexamethylene bis-acrylamide; vinyl esters such as divinyl succinate, divinyl phthalate, and divinyl benzene-1,3-disulfonate; styrene and derivatives thereof; and N-vinyl compounds, such as N-vinyl carbazole. Numerous other unsaturated monomers polymerizable by free-radical initiated polymerization and useful in photopolymerizable compositions are known to those skilled in the art. A list of representative monomers is given by Ishikawa, U.S. Pat. No. 4,481,276. For photoresist applications the preferred monomers are trimethylol propane triacrylate, the triacrylate ester of ethoxylated trimethylolpropane, tetraethylene glycol diacrylate, and tetraethylene glycol dimethacrylate.

The binder is an optional component present in the preferred photopolymerizable compositions of this invention. The binder is a preformed macromolecular polymeric or resinous material. In general, the binder should be soluble, or at least swellable, in the coating solvent and compatible with the other components of the photopolymerizable system. Representative binders are poly(methyl methacrylate) and copolymers of methyl methacrylate with other alkyl acrylates, alkyl methacrylates, methacrylic acid, and/or acrylic acid; poly(vinyl acetate) and its partially hydrolyzed derivatives; gelatin; cellulose esters and ethers, such as cellulose acetate butyrate; and polyethylene oxides. Numerous other binders useful in photopolymerizable compositions are known to those skilled in the art. A list of representative binders is given by Ishikawa, U.S. Pat. No. 4,481,276.

Although the borate anion is generally unstable in the presence of strong acid, the use of acidic binders in the practice of this invention is not precluded. It is preferred, however, that the binder contain acid units derived from weakly acidic monomers, such as acrylic acid and methacrylic acid, and/or the binder have a low acid number. For photoresist applications the preferred binders are copolymers of methyl methacrylate, ethyl acrylate, and methacrylic acid. Copolymers of methyl methacrylate, ethyl acrylate, and methacrylic acid copolymerized with a small amount of allyl methacrylate may also be used to advantage.

As disclosed in Keys, U.S. Pat. No. 4,942,102; Monroe, U.S. Pat. No. 4,942,112; Smothers, U.S. Pat. No. 4,959,284; and Trout, U.S. Pat. No. 4,963,471, in the preferred compositions adapted for the preparation of holograms, either the monomer or the binder contains one or more moieties selected from the group consisting of (1) an aromatic moiety selected from the group consisting of (i) substituted or unsubstituted phenyl, (ii) substituted or unsubstituted naphthyl, and (iii) substituted or unsubstituted heterocyclic aromatic moiety having up to three rings; (2) chlorine; (3) bromine and (4) mixtures thereof; and the other constituent is substantially free of said moiety.

For systems in which the monomer contains the indicated group and the binder is free of the indicated group preferred liquid monomers are: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-biphenyl acrylate, ethyl 1-benzoyl-2-vinyl-1-cyclopropane carboxylate and mixtures thereof. Preferred solid monomers, which may be used in combination with liquid monomers are: N-vinyl carbazole; 2,4,6-tribromophenyl acrylate or methacrylate; pentachlorophenyl acrylate or methacrylate; 2-naphthyl acrylate or methacrylate; 2-(2-naphthyloxy)ethyl acrylate or methacrylate; and mixtures thereof. Preferred binders for use in these systems are: cellulose acetate butyrate; poly(methyl methacrylate); poly(vinyl butyral); poly(vinyl acetate); and fluorine containing binders containing 3 to 25% by weight fluorine, such as copolymers of vinyl acetate with tetrafluoroethylene and/or hexafluoropropylene. For reflection holograms, the preferred binders are poly(vinyl butyral), poly(vinyl acetate), and copolymers of vinyl acetate with tetrafluoroethylene and/or hexafluoropropylene containing 3 to 25% by weight fluorine, such the 82:18 (mole %) vinyl acetate/tetrafluoroethylene copolymer.

For systems in which the binder contains the indicated group and the monomer is free of the indicated group, preferred monomers are: triethyleneglycol diacrylate and dimethacrylate, diethyleneglycol diacrylate, decanediol diacrylate, ethoxyethoxyethyl acrylate, isobornyl acrylate, ethyl 1-acetyl-2-vinyl-1-cyclopropane carboxylate, ethyl 2-vinylcyclopropane-1,1-dicarboxylate and mixtures thereof. Preferred binders for these systems are: polystyrene and copolymers containing at least about 60% styrene. Particularly preferred binders include polystyrene, 75:25 poly(styrene/acrylonitrile), and 70:30 poly(styrene/methyl methacrylate), as well as mixtures thereof.

If crosslinking of the holographic photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable poly-functional monomers include di-(2-acryloxyethyl)ether of bisphenol A, ethoxylated bisphenol A diacrylate, and the like. A preferred crosslinking is ethoxylated bisphenol A diacrylate.

Other Components

Other components conventionally added to photopolymerizable compositions can be present to modify the physical properties of the film. Such components include: plasticizers, thermal stabilizers, optical brighteners, ultraviolet radiation absorbing materials, adhesion modifiers, coating aids, and release agents.

A plasticizer may be present to modify adhesion, flexibility, hardness, and other mechanical properties of the film in a conventional fashion. When a binder is present, a plasticizer would be selected which is compatible with the binder as well as the monomer and other components of the composition. With acrylic binders, for example, plasticizers can include dibutyl phthalate and other esters of aromatic acids; esters of aliphatic polyacids, such as diisooctyl adipate; aromatic or aliphatic acid esters of glycols, polyoxyalkylene glycols, aliphatic polyols; alkyl and aryl phosphates; and chlorinated paraffins. In general, water insoluble plasticizers are preferred for greater high humidity storage stability, but are not necessary to get improved latitude.

Many ethylenically unsaturated monomers are subject to thermal polymerization, especially when stored for long periods or at elevated temperatures. Normally a conventional thermal polymerization inhibitor will be present to improve the storage stability the photopolymerizable composition. The nitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Typical coating aids are polyethylene oxides, such as Polyox ® WSRN, and fluorinated nonionic surfactants, such as Fluorad ® FC-430 and Fluorad ® FC-431.

Depending on the application, other inert additives can be employed such as dyes, pigments and fillers. These additives are generally present in minor amounts so as not to interfere with the exposure of the photopolymerizable layer.

Composition

While the composition of the photopolymerizable composition will depend on the intended application, when the composition is to be used as a dry film, in general, the binder should be at least about 25% and the monomer should not exceed about 60%, based on the total weight of the composition. If the amount of binder is below approximately 25%, or the amount of monomer exceeds approximately 60%, the composition has insufficient viscosity to form a solid film. While the amount of initiator system present will depend on the thickness of the layer and the desired optical density for the intended application, in general, about 0.1% to about 10% will be present.

Typical compositions are by weight: binder(s) 25 to 90%, preferably 45 to 75%; monomer(s), 5 to 60%, preferably, 15 to 50%; plasticizer, 0 to 25%, preferably, 0 to 15%; photoinitiator system, 0.01 to 10%, preferably 0.1 to 5%; and other ingredients, 0 to 5%, typically 0 to 4%.

The amount of dye present depends on the wavelength(s) of actinic radiation used for exposure, the absorption spectrum of the dye, and the thickness of the photopolymer coating. As described by Thommes and Webers, *J. Imag. Sci.*, 29, 112 (1985), an optical density of 0.43 produces efficient photopolymerization for systems which are developed by washout, such as photoresists. It is generally preferred that the absorption maximum of the dye be matched to the intensity maximum of the source of actinic radiation. In general the dye will comprise about 0.01 to about 1.0% preferably about 0.1 to about 0.5% of the composition.

The amount of borate salt present is limited by its solubility. Although as much as 1% or more borate salt may be added in favorable cases, addition of too much borate salt may adversely affect the dark stability and shelf life of the photopolymer. In general, the concentration of borate salt should be by weight between about 0.05 and about 1%. A preferred range is about 0.1 to about 1.0%. When present, the triazine will generally comprise about 0.03 to about 3%, preferably about 0.1 to 1%, of the composition.

Substrates/Coating

The photopolymerizable compositions can be coated onto a wide variety of substrates. By "substrate" is meant any natural or synthetic support, preferably one which is capable of existing in a flexible or rigid form. For example, the substrate can be a metal sheet or foil, a sheet or film of synthetic organic resin, cellulose paper, fiberboard, and the like, or a composite of two or more of these materials.

The particular substrate will generally be determined by the intended application. For example, when printed circuits are produced, the substrate may be a plate which is a copper coating on fiberboard; in the preparation of lithographic printing plates, the substrate may be anodized aluminum. Specific substrates include alumina-blasted aluminum, anodized aluminum, alumina-blasted polyethylene terephthalate film, polyethylene terephthalate film, e.g., resin-subbed polyethylene terephthalate film, polyvinyl alcohol-coated paper, cross-linked polyester-coated paper, nylon, glass, cellulose acetate film, heavy paper such as lithographic paper, and the like.

The photopolymerizable layer may prepared by mixing the ingredients of the photopolymerizable composition in a solvent, such as dichloromethane, usually in the weight ratio of about 15:85 to 25:75 (solids to solvent), coating on the substrate, and evaporating the solvent. Coatings should be uniform. While the thickness of the layer will depend on the intended application, for dry film photoresists the coating should have a thickness of about 0.2 to 4 mil (5 to 100 microns), preferably 0.5 to 2 mil (13 to 50 microns), when dry. For protection, a release film, such as polyethylene or polypropylene, may be placed over the photopolymerizable layer after the solvent evaporates.

Alternatively, since photopolymer compositions are quickly and efficiently coated onto polymer films using continuous web coating techniques, it may be convenient to coat the photopolymerizable composition onto a polymer film support, such as polyethylene terephthalate film, and laminate the resulting photopolymerizable layer to the substrate prior to exposure. The photopolymerizable layer may be protected until it is ready for use by, preferably, a release film, such as polyethylene or polypropylene, applied as the coated polymer film emerges from the drier. After removal of the release film, the photopolymerizable layer can then be laminated to the support. The polymer film support then acts as a coversheet which is removed after exposure.

Exposure/Image Formation

Any convenient source or sources of actinic radiation providing wavelengths in the region of the spectrum that overlap the absorption bands of the sensitizer can be used to activate photopolymerization. By "actinic radiation" is meant radiation which is active to produce the free-radicals necessary to initiate polymerization of the monomer(s). The radiation can be natural or artificial, monochromatic or polychromatic, incoherent or coherent, and for high efficiency should correspond closely to in wavelength to the absorption of the initiator system. Conventional light sources include fluorescent lamps, mercury, metal additive and arc lamps. Coherent light sources are xenon, argon ion, and ionized neon lasers, as well as tunable dye lasers and the frequency doubled neodymium:YAG laser, whose emissions fall within or overlap the visible absorption bands of the sensitizer.

For the exposure of holographic photopolymer systems coherent light sources, i.e., lasers, are required. Typically ion lasers, which have the required stability and coherence length but operate at a few lines of fixed wavelength, are used. With the development of photopolymer films that are sensitized across the visible spectrum, tunable lasers are required to match the broad spectral sensitivity of these materials. Since it is often desirable to record the hologram or holographic optical element, i.e., a hologram which acts as a diffraction grating, a mirror, a lens, or a combination of optical elements) with the same wavelength actinic radiation which will be used for reconstruction, tunable lasers offer added flexibility of recording a hologram and making a holographic optical element at any desired wavelength or at more than one selected wavelength.

Many wavelength tunable laser sources are now practical and can be used for holography. One type of tunable laser, the dye laser, can operate at any wavelength from the ultraviolet to the infra-red by the proper choice of pump source and dye medium. Dye laser systems can be pulsed with pulses of light as short as a few femtoseconds or can operate in the continuous wave mode. Continuous wave dye lasers with linear and ring cavity configurations can be pumped by other lasers, for example argon and krypton ion lasers, resulting in high average power. The bandwidth of the dye lasers can be narrowed with the use of intracavity etalons resulting in long coherence lengths. Advantages of these laser systems are the added control of wavelength and coherence length.

In the preparation of holograms from the compositions of this invention, the hologram is fixed by a second, overall exposure to actinic radiation. If the hologram is a reflection hologram and the binder is poly(vinyl butyral), poly(vinyl acetate), or a copolymer of vinyl acetate with tetrafluoroethylene and/or hexafluoropropylene containing 3 to 25% by weight fluorine, the refractive index modulation of the hologram can be enhanced by heating to 100–150° C. for about 0.5–1.5 hours following overall exposure.

Syntheses

Squarylium Compounds

The sensitizers can be prepared by conventional synthetic procedures. Sensitizers S-1, S-10, and S-11 are described in H. E. Sprenger and W. Ziegenbein, *Ang. Chem. Int. Ed.*, 6, 553–554 (1967). Sensitizer S-1 is also described in A. Treibs and K. Jacob, *Justus Liebigs Ann. Chem.*, 699, 153–167 (1966) and 712, 123–137 (1968). Sensitizer S-2 is described in N. Kuramoto, K. Natsukawa, and K. Asao, *Dyes and Pigments*, 11, 21–35 (1989). Sensitizer S-5 is described in Pease et al., U.S.

Pat. No. 4,830,786. Sensitizers S-8 and S-9 are described in P. M. Kazmaier, G. K. Hamer, and R. A. Burt, *Can. J. Chem.*, 68, 530–536 (1990). Sensitizers S-13 and S-14 are described in Gravestein, U.S. Pat. No. 4,508,811. The general methods described in these publications can be used to prepare other symmetrical squarylium compounds, such as, for example, S-3, S-4, S-6, S-12, S-13, S-14, and S-15. As examples, the syntheses of Sensitizers S-3, S-12 and S-13 are given below.

Synthetic routes to unsymmetrical squarylium compounds are described in A. Triebs and K. Jakobs, *Justus Liebigs Ann. Chem.*, 712 123–137 (1968) Kampfer, U.S. Pat. No. 3,617,270, Law, U.S. Pat. No. 4,524,219, and Pease et al., U.S. Patent 4,830,786. Unsymmetrical squarylium compound S-7 is described in Trout et al., U.S. Pat. application No. 07/465,823, filed Jan. 12, 1990.

Synthesis of Sensitizer S-3. A solution of 2,3,3-trimethyl-(3H)-indole (51.5 g, 0.324 mol), and 1,3-dibromopropane (523 g, 2.6 mol), was heated at 100° C. for 20 hours, during which time the reaction mixture partially solidified. The reaction mixture was chilled in an ice bath and the solids were broken up and filtered. The resulting wetcake was washed well with acetone and dried in vacuo at 55° C. The product isolated, 60.2 g, was determined by proton NMR to be a mixture of two bromide salts (Compounds I and II) and was used in the next step without further purification.

The crude mixture of I and II, 49.6 g, was reacted with 39.0 g (0.30 mol) of N,N-diisopropylethylamine in 500 mL of absolute ethanol at reflux for 20 hours. The reaction mixture was allowed to cool to room temperature and then poured into 1000 mL of water and extracted three times with 300 mL portions of diethyl ether. The combined ether extracts were washed five times with 500 mL portions of water followed by 500 mL of saturated sodium chloride solution. The separated ether layer was dried over anhydrous sodium sulfate and evaporated to yield 29.5 g of a crude brown oil (Compound III) that was sufficiently pure by NMR for use in the next synthetic step. The overall yield for the two step sequence was 48%.

Compound III (4.5 g, 22.7 mmol), was added to a suspension of squaric acid, (1.25 g, 11 mmol), in 65 mL of 2:1 by volume n-butanol:toluene and the mixture was refluxed with good stirring for 18 hours while continuously removing the water of reaction in a Dean Stark trap. The reaction mixture was then chilled in an ice bath and the precipitate collected by filtration and washed with ether. The wetcake was dried in vacuo at 55° C. to give 3.5 g of sensitizer S-3, 67% yield, m.p. 294–295° C., $\lambda$max=678 nm, $\epsilon$=260,000 (dichloromethane).

Synthesis Sensitizer S-12 A mixture of 9.2 g (70 mmol) of 2-methyl indolizine, which can be prepared by the method of Batroff and Flitsch, *Justus Liebios Ann. Chem.*, 621–628 (1987) and 4.0 g (35 mmol) of squaric acid in 230 mL of 2:1 by volume n-butanol:toluene was refluxed for 3 hours while continuously removing the water of reaction in a Dean Stark trap. The reaction mixture was cooled to room temperature and the precipitate collected by filtration and washed with ether. The wetcake was dried in vacuo at 55° C. to give 10.8 g of sensitizer S-12, 90% yield, m.p. 265–267° C., $\lambda$max=684 nm, $\epsilon$=165,000 (dichloromethane).

Synthesis of Sensitizer S-13 A mixture of 9.0 g (40.4 mmol) of 2-(4-methoxyphenyl)-indolizine (which may be prepared by a method similar to that used to prepare 2-phenylindolizine as described by Borrows, Holland, and Kenyon, *J. Chem. Soc.*, C, 1946, 1069–1075), and 2.3 g (20.2 mmol) of squaric acid in 230 mL of 2:1 n-butanol:toluene was refluxed for 4 hours. The reaction mixture was cooled to room temperature and the precipitate collected by filtration and washed with n-butanol and ether. The wetcake was dried in vacuo at 55° C. to give 10.1 g of sensitizer S-13, 95% yield, m.p. 285–287° C, $\lambda$max=696 nm, $\epsilon$=180,000 (dichloromethane).

Triazines

Triazines can be prepared by conventional synthetic procedures, as given, for example in T. R. Norton, *J. Am. Chem. Soc.*, 72, 3527–3528 (1950); T. L. Cairns, et al., *J. Am. Chem. Soc.*, 74, 5633–5636 (1952); C. Geundmann, et al., *Justus Liebios Ann. Chem.*, 577, 77–95 (1952) and F. C. Schaefer, *J. Org., Chem.*, 29, 1527, 1964. Triazines T-1, T-6, T-7, and T-10 are described in K. Wakabayashi, M. Tsunoda, and Y. Suzuki, *Bull. Chem. Soc. Japan*, 42, 2924–2930 (1969), and the general procedures given in this reference can be used to prepare other triazines such as T-2, T-5, T-8 and T-9. Triazines T-2 and T-4 are described in Pawlowski, European Patent Application 89/102607. Triazine T-8 is described in Coyle, U.S. Pat. No. 4,912,218.

Synthesis of Triazine T-3 Choline chloride (4.18 g, 29.9 mmol) and 4-(4,6-bis-trichloromethyl-s-triazine-2-yl)-benzoyl chloride, 13.5 g (29.7 mmol), which can be prepared by the procedure described in Pawlowski, European Patent Application No. 89102607.1 (publication EP 0 332 042), were ground together in a mortar and pestle with care taken to exclude moisture. The mixture was then transferred to a round bottom flask and placed under vacuum. The flask was immersed in an oil bath, pre-equilibrated to 175° C, until the contents of the flask had melted. At this point, some bubbling was observed in the reaction mixture due to the evolution of hydrogen chloride gas. Once the reaction mixture had melted, the oil bath and the contents of the flask were allowed to cool slowly to 150° C. The contents of the flask resolidified as the mixture cooled. After holding the reaction mixture at 150° C. for one hour, the flask was removed from the oil bath and cooled to room temperature. The resulting solid mass, 16.7 g, was broken up and slurried in 50 mL of dichloromethane for an hour, filtered, and washed well with fresh dichloromethane. The filtrate was evaporated and the solid residue dried. This residue, 9.6 g, was then slurried well in 190 mL of ethyl acetate for 6 hours, filtered, and dried in vacuo at 55° C. to give 4.2 g of triazine T-3, m.p. 211–214° C., in 25% yield, which analyzed pure (95+%) by proton NMR and was used as such.

Industrial Applicability

The photopolymerizable compositions of this invention show good visible light sensitization which allows them to be exposed with a variety of visible light sources, especially lasers which emit in the longer wavelength region of the visible spectrum. The broad sensitization range enables polymeric images, which may be further processed by development to produce resist images, or other relief images, to be formed. These compositions are useful in printing plates for offset and letter press, engineering drafting films, as well as photoresists in liquid or dry film form for making printed circuits or in chemical milling or in solder masks.

Certain compositions of this invention are particularly useful for the formation of holograms in which sensitivity to visible lasers is required. In particular, the sensitizers used in the compositions of this invention are sensitive to actinic radiation in the red region of the visible spectrum and, when combined with a sensitizer or sensitizers which are sensitive to the actinic radiation in the blue and green regions of the visible spectrum, produce photopolymerizable compositions in which multiple holograms, generated by actinic radiation of different wavelengths, can be prepared. These holograms are particularly useful in the preparation of multicolor display holograms. They can also be used as holographic notch filters when it is desired to protect against more than one wavelength of radiation.

Other specific uses for the compositions of this invention and the holograms and multicolor holograms prepared therefrom will be evident to those skilled in the art.

The advantageous properties of this invention can be observed by reference to the following examples which illustrate, but do not limit, the invention.

EXAMPLES

Glossary

Carboset® 1034: Poly(methyl methacrylate/ethyl acrylate/methacrylic acid) (44/35/21); MW 50,000; Tg 87° C.; Union Carbide, Danbury, Conn.

FAW: Cyclopentanone, 2,5-bis[(1,3-dihydro-1,3,3-trimethyl-2H-indol-2-ylidene)ethylidene]-; CAS 27713-85-5

FC-430: Fluorad® FC-430, liquid nonionic surfactant; fluoroaliphatic polymeric esters; CAS 11114-17-3; 3M Company, St. Paul, Minn.

HTMAP: (2-Hydroxyethyl)trimethylammonium triphenylbutyl borate; choline triphenylbutylborate JAW: Cyclopentanone, 2,5-bis[(2,3,6,7-tetrahydro-1H,5H-benzo[ij]quinolizin-9-yl)methylene]-; CAS 125594-50-5.

Photomer® 4039: Phenol ethoxylate monoacrylate; CAS 56641-05-5; Henkel Process Chemical Company; Ambler, Penna.

Sartomer 349: Ethoxylated bisphenol A diacrylate; CAS 24447-78-7; Sartomer Company, West Chester, Penna.

Sensitizer S-1: 3H-Indolium, 2-[[3-[(1,3-dihydro-1,3,3-trimethyl-2H-indol-2-ylidene)methyl]-2-hydroxy-4-oxo-2-cyclobuten-1-ylidene]methyl]-1,-3,3-trimethyl-, hydroxide, inner salt; $\lambda max = 634$ nm; CAS 14238-53-0, CAS 12243-46-8

Sensitizer S-2: Cyclobutenediylium, 1,3-bis[(1-ethyl-1,3-dihydro-3,3-dimethyl-2H-indol-2-ylidene)methyl]-2,4-dihydroxy-, dihydroxide, bis(inner salt); $\lambda_{max} = 635$ nm; CAS 88475-75-6

Sensitizer S-3: 10H-Pyrido[1,2-A]indolium, 6,7,8,9-tetrahydro-10,10-dimethyl-9-[2,4-dioxo -3-(6,7,8,10-tetrahydropydido[1,2-A]indol-9- yl)cyclobutylidene-, hydroxide, inner salt; $\lambda_{max} = 678$ nm Sensitizer S-4: Cyclobutenediylium, 1,3-bis(5-chloro-1,3-dihydro-1,3,3-trimethyl-2H-indol-2-ylidene)methyl]-2,4-dihydroxy-, dihydroxide, bis(inner salt); $\lambda_{max} = 640$ nm; CAS 72936-99-3

Sensitizer S-5: Cyclobutenediylium, 1,3-bis[(1,3-dihydro-5-methoxy-1,3,3-trimethyl-2H-indol -2-ylidene)-methyl]-2,4-dihydroxy-, dihydroxide, bis(inner salt): $\lambda_{max} = 651$ nm; CAS 123778-82-5

Sensitizer S-6: 1H-Benz[e]indolium, 2-[[3-[(1,3-dihydro-1,1,3-trimethyl-2H-benz [e]indol-2-ylidene)methyl]-2-hydroxy-4-oxo-2-cyclobuten-1- ylidene]methyl]-1,1,3-trimethyl-, hydroxide, inner salt; $\lambda_{max} = 664$ nm; CAS 116477-16-8

Sensitizer S-7: 3H-Indolium, 2-[[3-[4-(dimethylamino)-phenyl]-2,4-dioxocyclobutylidene]methyl]-1,3,3-trimethyl-, hydroxide, inner salt; $\lambda_{max} = 633$ nm Sensitizer S-8 1H-Benzo[ij]quinolizinium, 2,3,5,6,7,9-hexahydro-9-[2-hydroxy-4-oxo-3-(2,3,6,7-tetrahydro-1H,5H-benzo[ij]quinolizin-9-yl)-2-cyclobuten-1-ylidene]-, hydroxide, inner salt; $\lambda_{max} = 662$ nm; CAS 53332-41-5, CAS 68842-56-8.

Sensitizer S-9: Cyclobutenediylium, 1,3-dihydroxy-2,4-bis(2,3,6,7-tetrahydro-8-hydroxy-1 H,5H-benzo[ij]-quinolizin-9-yl)-, dihydroxide, bis(inner salt); $\lambda_{max} = 667$ nm); CAS 9 3470-31-6

Sensitizer 10: Benzothiazolium, 3-ethyl-2-[[3-[3-ethyl-2(3H)-benzothiazolylidene)methyl]-2-hydroxy-4-oxo-2-cyclobuten-1-ylidene]methyl]-, hydroxide, inner salt; $\lambda_{max} = 669$ nm; CAS 109201-66-3

Sensitizer S-11: Cyclobutenediylium, 1,3-bis[(3-ethyl-2(3H)-benzoselenazolylidene)methyl]-2,4-dihyroxy-, dihydroxide, bis(inner salt); $\lambda_{max} = 684$ nm; CAS 43134-08-3, CAS 1 2243-37-7

Sensitizer S-12: Cyclobutenediylium, 1,3-dihydroxy-2,4-bis(2-methyl-3-indolizinyl)-, dihydroxide, bis(inner salt); $\lambda_{max} = 684$ nm; CAS 72907-67-6

Sensitizer S-13: 3H-Indolizinium, 2-(4-methoxyphenyl)-3-[3-[2-(4-methoxyphenyl)-2-indolizinly]-2,4-dioxycyclobutylidene]-, hydroxide, inner salt; $\lambda_{max} = 696$ nm Sensitizer S-14: Cyclobutenediylium, 1,3-bis[[2,6-bis(1,1-dimethylethyl)-4H-pyran-4-ylidene]methyl]-2,4-dihydroxy-, dihydroxide, bis(inner salt); $\lambda_{max} = 714$ nm; CAS 93072-11-8

Sensitizer S-15: Thiopyrylium, 4-[[3-[[2,6-bis(1,1-dimethylethyl) -4H-thiopyran-4- ylidene]methyl]-2-hydroxy-4-oxo-2-cyclobuten-1-ylidene]methyl]-2,6-bis (1,1-dimethylethyl)-, hydroxide, inner salt; $\lambda_{max} = 814$ nm; CAS 88878-49-3, CAS 118794-48-2

TMAB: Tetramethylammonium triphenylbutyl borate; CAS 117522-01-7

TBAPB: Tetrabutylammonium tetraphenylborate; CAS 15527-59-5

TFE/VAc: 21:79 Poly(tetrafluoroethylene/vinylacetate)

TMPEOTA: Triacrylate ester of ethoxylated trimethylolpropane; CAS 28961-43-5

TMPTA: Trimethylolpropane triacrylate; 2-ethyl-2-(hydroxymethyl)-1,3-propane-diol triacrylate; CAS 15625-89-5

Triazine T-1: 1,3,5-Triazine, 2,4,6-tris(trichloromethyl)-; CAS-6542-67-2

Triazine T-2: Benzoic acid, 4-[4,6-bis(trichloromethyl)-1,3,5-triazin-2-yl]-, methyl ester; CAS 125775-49-7

Triazine T-3: Ethanaminium, 2-[[4-[4,6-bis(trichloromethyl)-1,3,5-trizin-2-yl]benoyl]oxy]-N,N,N-trimethyl-, chloride Triazine T-4: Benzoic acid, 4-[4,6-bis(trichloromethyl)-1,3,5-triazin-2- yl]-; CAS 125775-50-0

Triazine T-5: 1,3,5-Triazine, 2,4-bis(trichloromethyl)-6-[4-(trifluoromethyl)phenyl]-; CAS 125407-19-4

Triazine T-6: 1,3,5-Triazine, 2-methyl-4,6-bis(trichloromethyl)-; CAS 949-42-8

Triazine T-7: 1,3,5-Triazine, 2-(4-methoxyphenyl)-4,6-bis(trichloromethyl)-; CAS 3584-23-4

Triazine T-8: 1,3,5-Triazine, 2-[4-(methylthio)phenyl]-4,6-bis(trichloromethyl)-; CAS 117482-71-0

Triazine T-9: 1,3,5-Triazine, 2,4,6-tris(dichloromethyl)-; CAS 5311-21-7
Vinac® B-100: Poly(vinyl acetate); M.W. 350,000; CAS 9003-20-7; Air Products; Allentown, Penna.
Structures of Sensitizers S-1 to S-15, Triazine-1 to Triazine-9 and Compounds I to IV are as follows:
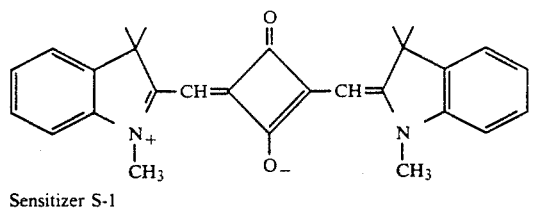
Sensitizer S-1
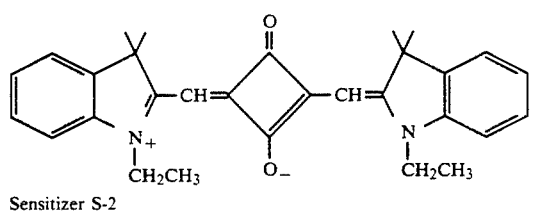
Sensitizer S-2
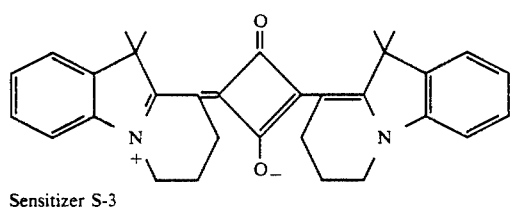
Sensitizer S-3
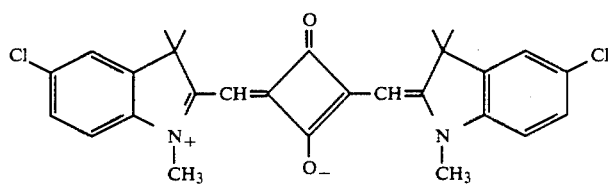
Sensitizer S-4
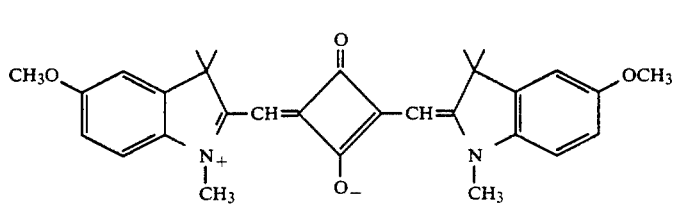
Sensitizer S-5
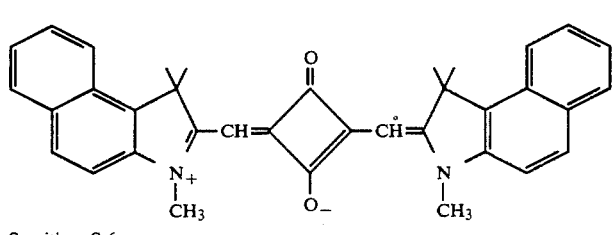
Sensitizer S-6
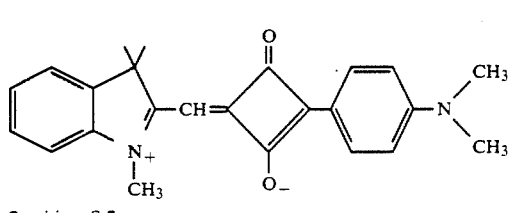
Sensitizer S-7

-continued
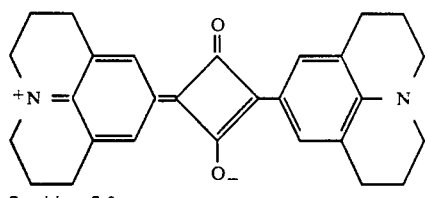
Sensitizer S-8
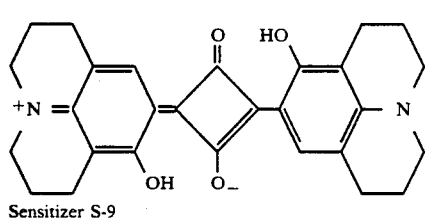
Sensitizer S-9
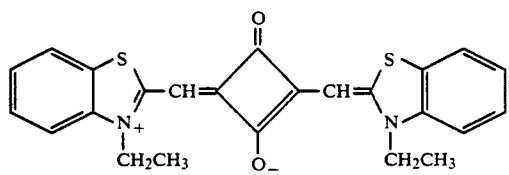
Sensitizer S-10
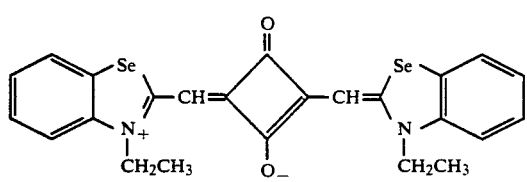
Sensitizer S-11
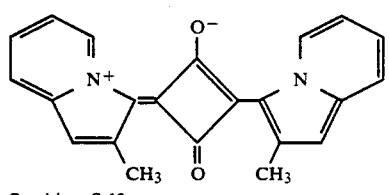
Sensitizer S-12
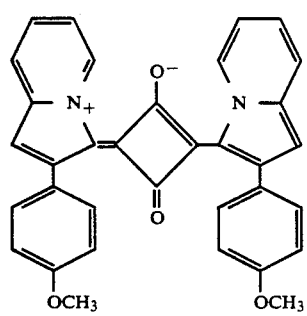
Sensitizer S-13
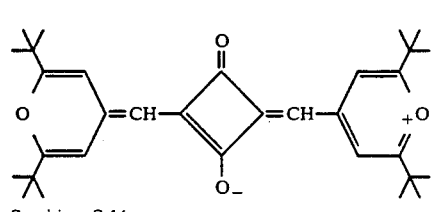
Sensitizer S-14

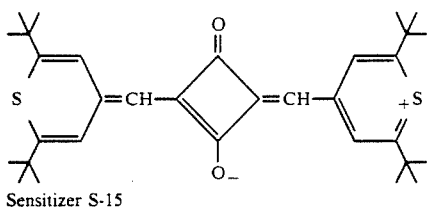
Sensitizer S-15
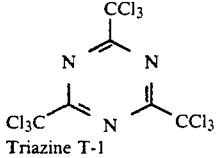
Triazine T-1
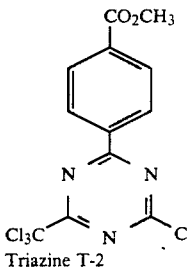
Triazine T-2
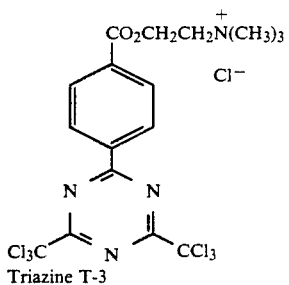
Triazine T-3
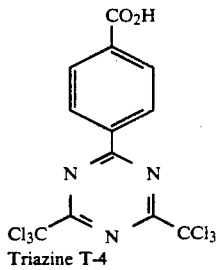
Triazine T-4
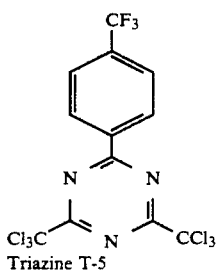
Triazine T-5
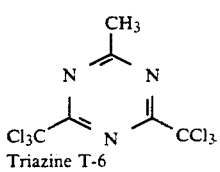
Triazine T-6

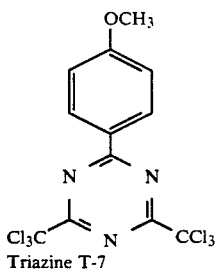
Triazine T-7

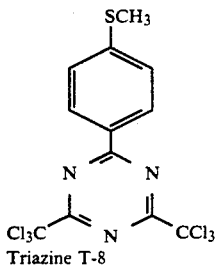
Triazine T-8

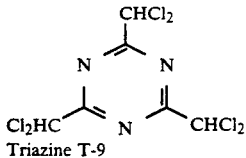
Triazine T-9

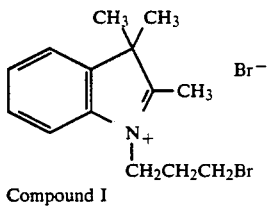
Compound I

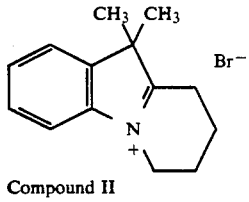
Compound II

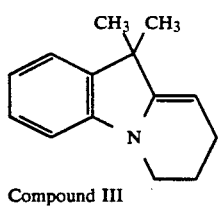
Compound III

-continued

GENERAL PROCEDURES

The absorption maxima for the sensitizers reported above were measured in dichloromethane.

In the Examples which follow it should be understood that "coating solution" refers to the mixture of solvent and additives which is coated, even though some of the additives may be in suspension rather than in solution, and that "total solids" refers to the total amount of nonvolatile material in the coating solution even though some of the additives may be nonvolatile liquids at ambient temperature.

Sample Preparation

Coating solutions were prepared in amber bottles under very dim light by adding components to the solvent and mixing with a mechanical stirrer until completely dissolved. The solvent was a mixture of dichloromethane (95% by weight) and 2-butanone (5%). All commercially available components were used as received from suppliers without further purification. Solutions were coated onto an about 2 mil (about 50 microns) thick clear film support of polyethylene terephthalate at a speed of 8 ft/min (4 cm/sec) using a Talboy web-coater equipped with an 8-mil (about 200 micron) doctor knife, 12 ft (3.6 M) drier set at 50-70° C., and a laminator station. A cover sheet of 1-mil (about 25 micron) polypropylene was laminated to the coatings as they exited the drier. Dry coating thickness ranged between 11 and 21 microns.

Sample Evaluation

Coated film was cut into 4×5 inch (about 10×13 cm) sections, the polypropylene coversheet was removed, and the film mounted by laminating the slightly tacky coating directly onto a clear glass plate. The polyethylene terephthalate film support covering the coating was left in place during subsequent handling, exposure, and thermal processing steps.

Coating samples mounted on glass plate were evaluated by recording a series holographic mirrors and determining hologram reflection efficiency as a function of exposure and wavelength. Holographic mirrors were formed by first tightly clamping the coating sampleplate between a clear glass coverplate and a front-surface aluminum mirror, with thin xylene layers between, and then exposing to a collimated 647 nm krypton-ion laser beam oriented perpendicular to the film plane and passing, in order, through the glass coverplate, xylene layer, film support, coating, glass sampleplate, and xylene layer and then reflecting back onto itself off the mirror. The laser beam had a 2.0 cm diameter and an intensity of 10 mW/cm$^2$. A series of sixteen holographic mirrors were recorded, each at a separate non-overlapping position on the sampleplate, with the laser exposure time incrementally varied using a computer controlled shutter positioned in the laser beam. Exposure times generally varied from 1.7 to 30 sec, corresponding to an exposure range of 17-300 mJ/cm$^2$. In cases where sample photosensitivity was low, exposure times up to 200 sec were used.

After completing the laser exposure series, the glass coverplate, aluminum mirror, and xylene layers were removed and the coating was overall exposed to ultraviolet and visible light from a Theimer-Strahler #5027 mercury-arc photopolymer lamp (Exposure Systems Corp, Bridgeport, Conn.) mounted in a Douthitt DCOP-X exposure unit (Douthitt Corp, Detroit, MI). The coating was thermally processed by heating the sampleplate at 100-110° C. for 60-65 min in a forced-air convection oven.

The transmission spectrum of each holographic mirror was recorded using a standard double-beam scanning spectrophotometer (Perkin Elmer model Lambda-9) with the sample beam oriented perpendicular to the plane of the sampleplate. Maximum reflection efficiency and peak reflection wavelength for each holographic mirror was measured from their transmission spectra. Graphs of reflection efficiency at the peak reflection wavelength versus total laser exposure were used to determine photospeed, defined as the minimum laser exposure required to obtain maximum holographic reflection efficiency.

EXAMPLES 1-5

These examples demonstrate the effect of varying TMAB level in compositions containing Sensitizer S-1 and Triazine T-1.

Solutions were prepared by dissolving 0.0052 g of Sensitizer S-1; 0.0156 g of FAW; 0.060 g of Triazine T-1; 1.08 g of 9-vinylcarbazole; 0.360 g of Sartomer 349; 2.16 g of Photomer ® 4039, 0.024 g of FC-430; 8.30 g of TFE/VAc (inherent viscosity 0.92 cp); and TMAB as indicated in Table 1 in a mixture of 64.6 g dichloromethane and 3.40 g 2-butanone. The solutions were coated, exposed, imaged, processed, and analyzed as described in the general procedures. Coating thicknesses were approximately 18-19 microns. Results are reported in Table 1.

TABLE 1

| Ex. No. | TMAB (g) | Photospeed (mJ/cm$^2$) | RE[a] (%) | Reflection Wavelength (nm) |
|---|---|---|---|---|
| 1 | 0.000 | 110 | 32.1 | 643 |
| 2 | 0.012 | 50 | 94.9 | 640 |
| 3 | 0.018 | 30 | 99.2 | 640 |
| 4 | 0.024 | 25 | 99.4 | 642 |
| 5 | 0.042 | 25 | 99.6 | 637 |

[a]Reflection Efficiency

EXAMPLE 6

This example demonstrates the use of tetrabutylammonium tetraphenylborate (TBAPB) in a composition containing Sensitizer S-1 and Triazine T-1.

A solution was prepared by dissolving 0.0052 g of Sensitizer S-1; 0.0156 g of FAW; 0.060 g of triazine T-1; 1.08 g of 9-vinylcarbazole; 0.360 g of Sartomer 349; 2.16 g of Photomer ® 4039; 0.024 g of FC-430; 8.30 g of TFE/VAc (inherent viscosity 0.92 cp); and 0.030 g TBAPB in a mixture of 64.6 g dichloromethane and 3.40 g 2-butanone. The solution was coated, imaged, processed, and analyzed as described in the general procedures. Coating thickness was approximately 18 microns, photospeed was 100 mJ/cm$^2$, and maximum reflection efficiency was 72.1% at 642 nm.

EXAMPLES 7-8

These examples demonstrate hologram recording at 514 nm (green) and 647 nm (red) in panchromatic photopolymerizable compositions containing green-light absorbing sensitizing dye and red-light absorbing Sensitizer S-1 along with Triazine T-1 and TMAB.

Solutions were prepared by dissolving 0.048 g of Triazine T-1, 0.024 g of TMAB, 0.878 g of 9-vinylcarbazole, 0.292 g of Sartomer 349, 1.76 g Photomer ® 4039, 0.020 g of FC-430, 6.72 g of TFE/VAc (inherent viscosity 0.92 cp), and dyes as indicated in Table 2 in a mixture of 52.5 g dichloromethane and 2.76 g 2-butanone. The solutions were coated, imaged, processed, and analyzed as described in the general procedures. Coating thicknesses were approximately 11-15 microns; maximum reflection efficiency was about 97-99%. Photospeeds are reported in Table 2.

TABLE 2

| Ex. No. | S-1 (g) | Dye (g) | 514 nm Photospeed (mJ/cm$^2$) | 647 nm Photospeed (mJ/cm$^2$) |
|---|---|---|---|---|
| 7 | 0.004 | JAW/0.0117 | 3.0 | 30 |
| 8 | 0.008 | FAW/0.0098 | 4.5 | 30 |

EXAMPLES 9-22

These examples demonstrate hologram recording at 647 nm in photopolymerizable compositions containing a squarylium compound, triazine T-1, and TMAB.

Solutions were prepared by dissolving 0.053 g of Triazine T-1; 0.026 g of TMAB; 0.945 g of 9-vinylcarbazole; 0.315 g of Sartomer 349; 1.89 g of Photomer ® 4039; 0.021 g of FC-430; 7.24 g of TFE/VAc (inherent viscosity 0.88 cp); and squarylium compound as indicated in Table 3 in a mixture of 56.5 g dichloromethane and 2.98 g 2-butanone. The solutions were coated, imaged, processed, and analyzed as described in the general procedures. Coating thicknesses were approximately 14-16 microns. Results are reported in Table 3.

TABLE 3

| Ex. No. | Squarylium Compound | Amount (g) | Photospeed (mJ/cm$^2$) | RE$^a$ (%) | Reflection Wavelength (nm) |
|---|---|---|---|---|---|
| 9 | S-1 | 0.0042 | 30 | 98.8 | 637 |
| 10 | S-2 | 0.0042 | 30 | 98.7 | 640 |
| 11 | S-3 | 0.0210 | 45 | 98.9 | 642 |
| 12 | S-4 | 0.0043 | 60 | 98.5 | 638 |
| 13 | S-5 | 0.0082 | 19 | 99.0 | 638 |
| 14 | S-6 | 0.0084 | 35 | 98.4 | 641 |
| 15 | S-7 | 0.0046 | 30 | 99.1 | 636 |
| 16 | S-8 | 0.0136 | 175 | 91.6 | 640 |
| 17 | S-9 | 0.0136 | 30 | 99.3 | 634 |
| 18 | S-10 | 0.0126 | 100 | 95.1 | 638 |
| 19 | S-11 | 0.0107 | 50 | 97.0 | 637 |
| 20 | S-12 | 0.0138 | 800 | 58.3 | 643 |
| 21 | S-13 | 0.0106 | 420 | 93.9 | 638 |
| 22 | S-14 | 0.0168 | 200 | 98.2 | 639 |

$^a$Reflection Efficiency

EXAMPLES 23-32

These examples demonstrate hologram recording at 647 nm in photopolymerizable compositions containing a triazine, sensitizer S-1, and TMAB.

Solutions were prepared by dissolving 0.0042 g of Sensitizer S-1; 0.026 g of TMAB; 0.945 g of 9-vinylcarbazole; 0.315 g of Sartomer 349; 1.89 g Photomer ® 4039; 0.021 g of FC-430; 7.24 g of TFE/VAc (inherent viscosity 0.88 cp); and triazine as indicated in Table 4 in a mixture of 56.5 g dichloromethane and 2.98 g 2-butanone. The solutions were coated, imaged at 647 nm to form holographic mirrors, overall cured with UV and visible light, heat processed, and analyzed as described in the general procedures. Coating thicknesses were approximately 19-21 microns. Results are reported in Table 4.

TABLE 4

| Ex. No. | Triazine | Amount (g) | Photospeed (mJ/cm$^2$) | RE$^a$ (%) | Reflection Wavelength (nm) |
|---|---|---|---|---|---|
| 23 | T-1 | 0.079 | 30 | 99.6 | 637 |
| 24 | T-2 | 0.079 | 30 | 99.9 | 638 |
| 25 | T-3 | 0 079 | 110 | 98.5 | 643 |
| 26 | T-4 | 0.079 | 13 | 98.5 | 637 |
| 27 | T-5 | 0.079 | 40 | 99.0 | 639 |
| 28 | T-6 | 0.079 | 50 | 97.9 | 640 |
| 29 | T-7 | 0.079 | 70 | 99.1 | 638 |
| 30 | T-8 | 0.079 | 55 | 99.5 | 637 |

$^a$Reflection Efficiency

EXAMPLE 31

This example demonstrates the use of dichloromethyl triazine T-9 in a composition containing S-1 and TMAB.

A solution was prepared by dissolving 0.0042 g of S-1, 0.079 g of T-9, 0.026 g TMAB, 0.945 g of 9-vinylcarbazole, 0.315 g of Sartomer 349, 1.89 g of Photomer ® 4039, 0.021 g of FC-430, and 7.25 g of TFE/VAc (23:77 wt %, inherent viscosity 1.52 cp) in a mixture of 56.5 g dichloromethane and 2.98 g 2-butanone. The solution was coated, imaged at 647 nm to form holographic mirrors, overall cured with UV and visible light, heat processed at 120° C. for 90 min, and analyzed as described in the General Procedures. Coating thickness was approximately 15 microns, photospeed was 140 mJ/cm$^2$, and maximum hologram reflection efficiency was 91% at 633 nm.

EXAMPLES 32-35

These examples demonstrate hologram recording at 647 nm in photopolymerizable compositions containing a squarylium compound, triazine T-1, and HTMAP.

Solutions were prepared by dissolving 0.079 g of triazine T-1, 0.026 g of HTMAP, 0.945 g of 9-vinylcarbazole, 0.315 g of Sartomer 349, 1.89 g of Photomer ® 4039, 7.24 g of TFE/VAc (23:77 wt %, inherent viscosity 0.92 cp), and squarylium compound as indicated in Table 3 in a mixture of 56.5 g dichloromethane and 2.98 g 2-butanone. The solutions were coated, imaged at 647 nm to form holographic mirrors, overall cured with UV nm and visible light, heat processed at 100° C. for 90 min, and analyzed as described in the General Procedures. Coating thicknesses are approximately 10.4-13.5 microns. Results are reported in Table 5.

TABLE 5

| Ex. No. | Squarylium Compound | Amount (g) | Photospeed (mJ/cm$^2$) | RE$^a$ (%) | Reflection Wavelength (nm) |
|---|---|---|---|---|---|
| 32 | S-1 | 0.0042 | 20 | 93 | 635 |
| 33 | S-9 | 0.0137 | 20 | 96 | 637 |
| 34 | S-11 | 0.0137 | 20 | 95 | 637 |
| 35 | S-14 | 0.0168 | 180 | 94 | 638 |

$^a$Reflection Efficiency.

EXAMPLE 36

This example illustrates the use of Sensitizer S-1 and a borate in a photoresist.

All operations were carried out under yellow lights. A stock solution containing Carboset ® 1034 (65.0%), TMPEOTA (26.0%), and TMPTA (9.0%) was prepared by dissolving the ingredients in 2-butanone (54.5% total solids). The indicated initiators were added to aliquots of the stock solution prior to coating. The indicated percentage of added initiator is the weight of added initiator in grams relative to 100 g of solids in the stock solution.

Solutions were board coated on 23 micron thick clear polyethylene terephthalate film with a 200 micron doctor blade to give a dry film thickness of approximately 38 microns. The coating solvent was 2-butanone containing about 5% of 2-propanol which was added to increase the solubility of the ingredients in the coating solution.

Films were hot roll laminated to copper, exposed under a Stouffer-41 target (Stouffer Industries, South Bend, Ind.) using a PC-130 printer (Du Pont, Wilmington, Del.). The polyethylene terephthalate was left in place as a coversheet during exposure. The Stouffer-41 target contains forty one sixth root of two steps. The polyethylene terephthalate film was removed and the exposed samples developed at 50% breakpoint (29° C, 1% aqueous sodium carbonate) using a Chemcut aqueous processor (Chemcut, State College, Penna.).

All exposed films which were capable of holding steps were also capable of imaging at least an about 250 micron line and space pattern. Those exposed films which were incapable of holding steps were also incapable of holding the line and space pattern. The results are shown in Table 6.

TABLE 6

| Initiator System | Exposure (mJ/cm$^2$) | (2)$^{1/6}$ Steps No Borate | Relative Borate$^a$ | Photospeed$^b$ |
|---|---|---|---|---|
| None | 1620 | 0 | 0 | c |
| 0.25% Sensitizer S-1 | 1639 | 0 | 15 | d |

$^a$0.12% Trimethyl ammonium triphenylbutyl borate (TMAB) added.
$^b$Photospeed of composition with borate added relative to the same composition without borate.
$^c$Control - no photopolymerization with or without added borate.
$^d$Not calculable - greater than 5.6.

EXAMPLE 37

This example illustrates exposure of a composition of this invention with a visible laser.

Film containing 0.25% Sensitizer S-1, with and without added borate, prepared as in Example 36, were laminated to copper as described in Example 36 and exposed with the 633 nm line of a 0.95 mW He-Ne laser (Oriel Corporation, Stratford, Conn.). The beam had an average intensity of 4.34 mW/cm$^2$ measure for a focused spot of 5 mm diameter. The beam intensity was Gaussian.

The samples were developed as described in Example 36. The size of the spot of photopolymer remaining after development was measured. Results are shown in Table 7.

TABLE 7

| Initiator System$^a$ | Exposure (mJ/cm$^2$) | Spot Size (mm) |
|---|---|---|
| No borate | 1042 | 0$^b$ |
| No borate | 1302 | 0 |
| Borate Added$^c$ | 260 | 0 |
| Borate Added$^c$ | 520 | 1.6 |
| Borate Added$^c$ | 781 | 2.3 |
| Borate Added$^c$ | 1042 | 2.5 |

$^a$0.25% Sensitizer S-1 in all samples.
$^b$No image remained after development.
$^c$0.12% Trimethyl ammonium triphenylbutyl borate (TMAB) added.

EXAMPLE 38

This example illustrates the use of Sensitizer S-4 and a borate in a photoresist.

The procedure of Example 36 was repeated except (1) sensitizer S-4 was used and (2) the coating solvent was 92:8 dichloromethane/methanol (33% solids). Exposure was carried out with a PC-130 printer either with unfiltered light or through a Dylux ® filter (Du Pont, Wilmington, Del.). The Dylux ® filter filters out ultraviolet radiation and passes visible radiation. Results are shown in Table 8.

TABLE 8

| Initiator System | Exposure (mJ/cm$^2$) | (2)$^{1/6}$ Steps No Filter | Filter$^a$ |
|---|---|---|---|
| Sensitizer S-4 | 3246 | 0$^b$ | 0$^b$ |
| Sensitizer S-4 + 0.12% TMAB | 3246 | 12 | 2 |
| Sensitizer S-4 + 0.12% HTMAP | 2164 | 18 | 9 |
| Sensitizer S-1 + 0.12% HTMAP | 2164 | 23 | 9 |

$^a$Dylux ® filter, which only passes visible radiation.
$^b$No image remained following development.

EXAMPLE 39

This example illustrates exposure of a composition containing a squarylium compound and a borate anion with a visible laser.

The films prepared in Example 38 were exposed with a HeNe laser at 633 nm following the procedure of Example 37. An average intensity of 3.18 mW/cm$^2$ was measured for a focused beam spot of 6 mm diameter. The beam intensity was Gaussian.

The samples were developed as described in Example 36. The size of the spot of photopolymer remaining after development was measured. Results are shown in Table 9.

TABLE 9

| Sensitizer | Spot Size (mm)$^a$ | |
|---|---|---|
| | 954 (mJ/cm$^2$) | 1908 mJ/$^2$ No Filter |
| Sensitizer S-4 | ND | 0$^b$ |
| Sensitizer S-4 + 0.12% TMAB | 1.02 | 1.8 |
| Sensitizer S-4 + 0.12% HTMAP | 2.2 | 2.8 |
| Sensitizer S-1 + 0.12% HTMAP | 1.5 | 2.8 |

$^a$Dylux ® filter, which only passes visible radiation.
$^b$No image remained following development.

Having described the invention, we now claim the following and their equivalents.

What is claimed is:

1. A photopolymerizable composition comprising:
   (A) an ethylenically unsaturated monomer; and
   (B) an initiator system, said initiator system comprising:
   (1) a squarylium compound selected from the group consisting of:

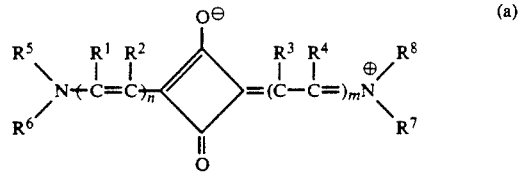

(a)

wherein:
R$^1$, R$^2$, R$^3$, and R$^4$ are each independently hydrogen, hydroxyl, halogen, alkyl of one to six carbon atoms, or substituted or unsubstituted aryl or heteroaryl group having from 5 to 10 atoms;

R$^5$, R$^7$, and R$^8$ are each independently hydrogen, a substituted or unsubstituted alkyl or cycloalkyl group having from 1 to 6 carbon atoms or a substituted or unsubstituted aryl or heteroaryl group having from 5 to 10 atoms;

or any of R$^1$, R$^2$, R$^3$, and R$^4$ groups are combined with any of R$^5$, R$^6$, R$^7$, and R$^8$ and/or with each other to a form a 5- to 7-membered substituted or unsubstituted carbocyclic or heterocyclic ring;

or any of R$^5$, R$^6$, R$^7$, and R$^8$ are joined together to form a 5- to 7-membered substituted or unsubstituted nitrogen-containing heterocyclic ring; and n and m are each independently 1 to 3; and

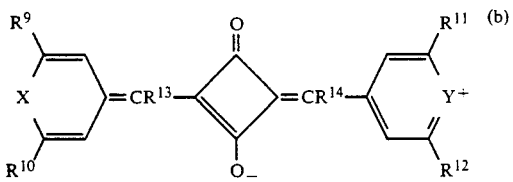

wherein

X and Y are each independently oxygen or sulfur and $R^9$, $R^{10}$, $R^{11}$, $R^{12}$, $R^{13}$, and $R^{14}$ are each independently alkyl groups from one to eight carbon atoms; and (2) a borate salt containing (a) an alkali metal cation or a quarternary ammonium cation and (b) a borate anion container represented by the formula:

$(BZ^1Z^2Z^3Z^4)^-$ wherein $Z^1$, $Z^2$, $Z^3$, and $Z^4$, the same or different, are selected from the group consisting of alkyl, aryl, aralkyl, alkenyl, alkynyl, alicyclic, heterocyclic, and allyl groups, with the proviso that at least one of $Z^1$, $Z^2$, $Z^3$, and $Z^4$ is not aryl.

2. The composition of claim 1 additionally comprising a binder.

3. The composition of claim 2 wherein said squarylium compound is selected from the group consisting of:

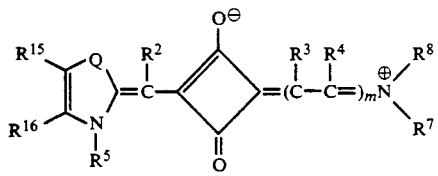

wherein;

$R^2$ is hydrogen or substituted or unsubstituted alkyl;

$R^5$ is (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

Q is O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl; $R^{15}$ and $R^{16}$ are joined together to form a 5- to 7-membered substituted or unsubstituted carbocyclic or heterocyclic ring; and m is 1 or 2.

4. The composition of claim 3 wherein said squarylium compound is selected from the group consisting of:

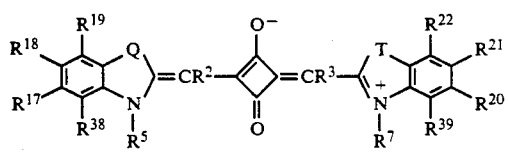

wherein $R^2$ and $R^3$ are each independently hydrogen or substituted or unsubstituted alkyl;

$R^5$ and $R^7$ are each independently (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring; and $R^3$ and $R^7$ are joined together to form a 5- to 7-membered substituted or unsubstituted carbocyclic ring; Q and T are each independently O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl;

$R^{17}$, $R^{18}$, $R^{19}$, $R^{20}$, $R^{21}$, $R^{22}R^{38}$, and $R^{39}$ are each independently hydrogen, halogen, dialkylamino, substituted or unsubstituted phenyl, substituted or unsubstituted alkyl, alkoxyl, or cycloalkyl having from 1 to 6 carbon atoms;

or ($R^{38}$ and $R^{17}$), ($R^{17}$ and $R^{18}$), or ($R^{18}$ and $R^{19}$) are joined in a substituted or unsubstituted aromatic ring containing 5 to 7 atoms; and, independently, ($R^{39}$ and $R^{20}$), ($R^{20}$ and $R^{21}$), or ($R^{21}$ and $R^{22}$) are joined in a substituted or unsubstituted aromatic ring containing 5 to 7 atoms.

5. The composition of claim 4 wherein Q and T are the same and equal to $CR^{41}R^{42}$.

6. The composition of claim 5 wherein $R^{41}$ and $R^{42}$ are the same and equal to methyl, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl.

7. The composition of claim 6 wherein $R^5$ and $R^7$ are the same and equal to methyl and $R^{18}$ and $R^{21}$ are the same and equal to hydrogen.

8. The composition of claim 5 wherein $R^{41}$ and $R^{42}$ are the same and equal to methyl, $R^{17}$, $R^{20}$, $R^{38}$, and $R^{39}$ are the same and equal to hydrogen, ($R^{18}$ and $R^{19}$) and ($R^{21}$ and $R^{22}$) are each joined in an unsubstituted carbocyclic aromatic ring containing 6 atoms; and $R^5$ and $R^7$ are each equal to methyl or ethyl.

9. The composition of claim 5 wherein $R^{41}$ and $R^{42}$ are the same and equal to methyl, ($R^2$ and $R^5$) and ($R^3$ and $R^7$) are each combined to form a six membered heterocyclic ring; $R^{17}$, $R^{19}$, $R^{20}$, $R^{22}$, $R^{38}$, and $R^{39}$, are the same and equal to hydrogen; and $R^{18}$ and $R^{21}$ are the same and equal to hydrogen, chloro, or methoxyl.

10. The composition of claim 4 wherein Q and T are the same and equal to S or Se, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl.

11. The composition of claim 2 wherein said squarylium compound is selected from the group consisting of:

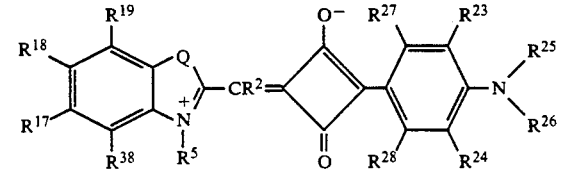

wherein

R$^2$ is hydrogen or substituted or unsubstituted alkyl;

R$^5$ is (1) substituted or unsubstituted alkyl or cycloalkyl having from 1 to 6 carbon atoms or (2) substituted or unsubstituted aryl or heteroaryl group having from 5 to 10 atoms;

or R$^2$ and R$^5$ are joined together to form a 5- to 7-membered substituted or unsubstituted carbocyclic ring;

Q is 0, S, Se, NR$^{40}$, or CR$^{41}$R$^{42}$, where R$^{40}$, R$^{41}$, and R$^{42}$ are each independently alkyl of about 1 to about 6 carbon atoms or substituted or unsubstituted phenyl;

R$^{17}$, R$^{18}$, R$^{19}$, and R$^{38}$ are each independently hydrogen, halogen, dialkylamino, substituted or unsubstituted phenyl, substituted or unsubstituted alkyl, alkoxyl, or cycloalkyl having from 1 to 6 carbon atoms;

or (R$^{38}$ and R$^{17}$), (R$^{17}$ and R$^{18}$), or (R$^{18}$ and R$^{19}$) are joined in a substituted or unsubstituted aromatic ring containing 5 to 7 atoms;

R$^{23}$, R$^{24}$, R$^{25}$, and R$^{26}$, are each independently hydrogen or alkyl of 1 to 6 carbon atoms, substituted or unsubstituted carbocyclic or heterocyclic ring;

or R$^{25}$ and R$^{26}$ are joined together to form a 5- to 7-membered heterocyclic ring;

or R$^{23}$ and R$^{25}$ are joined together to form a 5- or 6-membered heterocyclic ring and independently R$^{24}$ and R$^{26}$ are joined together to form a 6-membered heterocyclic ring, and R$^{27}$ and R$^{28}$ are independently hydrogen, hydroxyl, or alkyl, alkoxyl, or cycloalkyl from 1 to 6 carbon atoms.

12. The composition of claim 11 wherein R$^2$, R$^{17}$, R$^{18}$, R$^{19}$, R$^{27}$, R$^{28}$, and R$^{38}$ are each hydrogen.

13. The composition of claim 12 wherein Q is C(CH3)2; R$^5$, R$^{25}$, and R$^{26}$ are independently methyl or ethyl; and R$^{23}$ and R$^{24}$ are each hydrogen.

14. The composition of claim 2 wherein the squarylium compound is selected from the group consisting of:

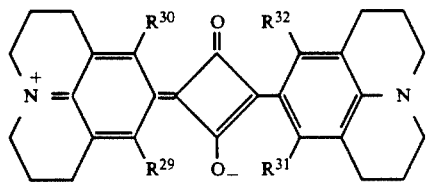

wherein

R$^{29}$, R$^{30}$, R$^{31}$, and R$^{32}$ are independently hydrogen, hydroxyl, or alkyl or alkoxyl of 1 to 6 carbon atoms.

15. The composition of claim 14 wherein which R$^{29}$ and R$^{31}$ are hydrogen and R$^{30}$ and R$^{32}$ are hydrogen or hydroxyl.

16. The composition of claim 2 wherein the squarylium compound is selected from the group consisting of:

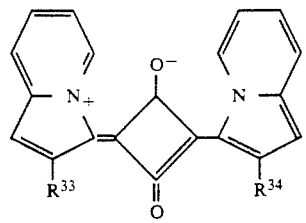

wherein

R$^{33}$ and R$^{34}$ are each independently hydrogen, halogen, substituted or unsubstituted alkyl of one to six carbon atoms, alkoxyl, or substituted or unsubstituted aryl or heteroaryl group having from 5 to 10 atoms.

17. The composition of claim 16 wherein R$^{33}$ and R$^{34}$ are hydrogen, alkyl, or substituted or unsubstituted aryl or heteroaryl group having from 5 to 6 atoms.

18. The composition of claim 17 wherein R$^{33}$ and R$^{34}$ are methyl or p-methoxyphenyl.

19. The composition of claim 2 wherein the squarylium compound is selected from the group consisting of:

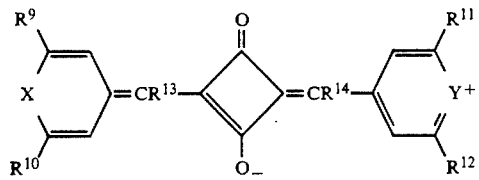

wherein

X and Y are each independently oxygen or sulfur and R$^9$, R$^{10}$, R$^{11}$, R$^{12}$, R$^{13}$, and R$^{14}$ are each independently hydrogen or an alkyl group having from one to eight carbon atoms.

20. The composition of claim 19 wherein R$^9$, R$^{10}$, R$^{11}$, and R$^{12}$ are each t-butyl and R$^{13}$ and R$^{14}$ are hydrogen.

21. The composition of claim 1 additionally comprising an s-triazine comprising at least one halogenated methyl group.

22. The composition of claim 21 additionally comprising a binder.

23. The composition of claim 21 wherein said halogenated methyl group comprises chloro.

24. The composition of claim 23 additionally comprising a binder.

25. The composition of claim 24 wherein said squarylium compound is selected from the group consisting of:

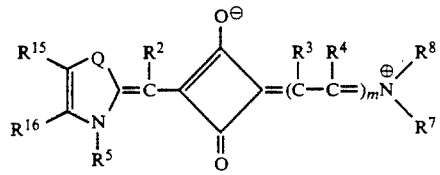

wherein:

R$^2$ is hydrogen or substituted or unsubstituted alkyl;

R$^5$ is (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

Q is O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl; $R^{15}$ and $R^{16}$ are joined together to form a 5- to 7-membered substituted or unsubstituted carbocyclic or heterocyclic ring; and m is 1 or 2.

26. The composition of claim 25 wherein said squarylium compound is selected from the group consisting of:

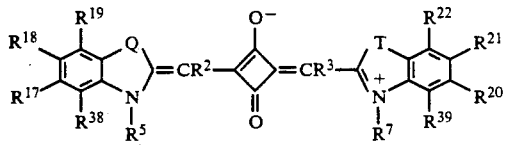

wherein $R^2$ and $R^3$ are each independently hydrogen or substituted or unsubstituted alkyl;

$R^5$ and $R^7$ are each independently (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring; and $R^3$ and $R^7$ are joined together to form a 5- to 7-membered substituted or unsubstituted carbocyclic ring;

Q and T are each independently O, S, Se, $NR^{40}$, or $CR^{41}R^{42}$, where $R^{40}$, $R^{41}$, and $R^{42}$ are each independently alkyl of 1 to 6 carbon atoms or substituted or unsubstituted phenyl; $R^{17}$, $R^{18}$, $R^{19}$, $R^{20}$, $R^{21}$, $R^{22}$, $R^{38}$, and $R^{39}$ are each independently hydrogen, halogen, dialkylamino, substituted or unsubstituted phenyl, substituted or unsubstituted alkyl, alkoxyl, or cycloalkyl having from 1 to 6 carbon atoms;

or ($R^{38}$ and $R^{17}$), ($R^{17}$ and $R^{18}$), or ($R^{18}$ and $R^{19}$) are joined in a substituted or unsubstituted aromatic ring containing 5 to 7 atoms; and, independently, ($R^{39}$ and $R^{20}$), ($R^{20}$ and $R^{21}$), or ($R^{21}$ and $R^{22}$) are joined in a substituted or unsubstituted aromatic ring containing 5 to 7 atoms.

27. The composition of claim 26 wherein Q and T are the same and equal to $CR^{41}R^{42}$.

28. The composition of claim 27 wherein $R^{41}$ and $R^{42}$ are the same and equal to methyl, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl.

29. The composition of claim 28 wherein $R^5$ and $R^7$ are the same and equal to methyl and $R^{18}$ and $R^{21}$ are the same and equal to hydrogen.

30. The composition of claim 27 wherein $R^{41}$ and $R^{42}$ are the same and equal to methyl, $R^{17}$, $R^{20}$, $R^{38}$ and $R^{39}$ are the same and equal to hydrogen, ($R^{18}$ and $R^{19}$) and ($R^{21}$ and $R^{22}$) are each joined in an unsubstituted carbocyclic aromatic ring containing 6 atoms; and $R^5$ and $R^7$ are each equal to methyl or ethyl.

31. The composition of claim 27 wherein $R^{41}$ and $R^{42}$ are the same and equal to methyl, ($R^2$ and $R^5$) and ($R^3$ and $R^7$) are each combined to form a six membered heterocyclic ring; $R^{17}$, $R^{19}$, $R^{20}$, $R^{22}$, $R^{38}$, and $R^{39}$, are the same and equal to hydrogen; and $R^{18}$ and $R^{21}$ are the same and equal to hydrogen, chloro, or methoxyl.

32. The composition of claim 26 wherein Q and T are the same and equal to S or Se, $R^5$ and $R^7$ are the same and equal to methyl or ethyl; $R^{17}$, $R^{19}$, $R^{20}$, $R^{22}$, $R^{38}$, and $R^{39}$ are the same and equal to hydrogen; and $R^{18}$ and $R^{21}$ are the same and equal to hydrogen, chloro, or methoxyl.

33. The composition of claim 24 wherein said squarylium compound is selected from the group consisting of:

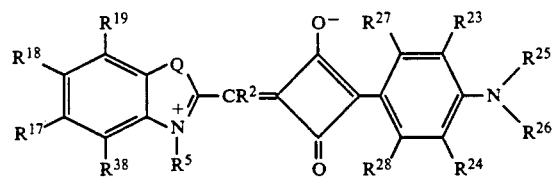

wherein $R^2$ is hydrogen or substituted or unsubstituted alkyl;

$R^5$ is (1) substituted or unsubstituted alkyl or cycloalkyl having from 1 to 6 carbon atoms or (2) substituted or unsubstituted aryl or heteroaryl group having from 5 to 10 atoms;

or $R^2$ and $R^5$ are joined together to form a 5- to 7-membered substituted or unsubstituted carbocyclic ring;

Q is O, S, Se, $NR^{40}$, or $CR^{41}R^{42}$ where $R^{40}R^{41}$, and $R^{42}$ are each independently alkyl of about 1 to about 6 carbon atoms or substituted or unsubstituted phenyl;

$R^{17}$, $R^{18}$, $R^{19}$, and $R^{38}$ are each independently hydrogen, halogen, dialkylamino, substituted or unsubstituted phenyl, substituted or unsubstituted alkyl, alkoxyl, or cycloalkyl having from 1 to 6 carbon atoms;

or $R^{38}$ and $R^{17}$), ($R^{17}$ and $R^{18}$), or ($R^{18}$ and $R^{19}$) are joined in a substituted or unsubstituted aromatic ring containing 5 to 7 atoms;

$R^{23}$, $R^{24}$, $R^{25}$, and $R^{26}$, are each independently hydrogen or alkyl of 1 to 6 carbon atoms, substituted or unsubstituted carbocyclic or heterocyclic ring;

or $R^{25}$ and $R^{26}$ are joined together to form a 5- to 7-membered heterocyclic ring;

or $R^{23}$ and $R^{25}$ are joined together to form a 5- or 6-membered heterocyclic ring and independently $R^{24}$ and $R^{26}$ are joined together to form a 6-membered heterocyclic ring, and $R^{27}$ and $R^{28}$ are independently hydrogen, hydroxyl, or alkyl, alkoxyl, or cycloalkyl from 1 to 6 carbon atoms.

34. The composition of claim 33 wherein $R^2$, $R^{17}$, $R^{18}$, $R^{19}$, $R^{27}$, $R^{28}$, and $R^{38}$ are each hydrogen.

35. The composition of claim 34 wherein Q is $C(CH_3)_2$; $R^5$, $R^{25}$, and $R^{26}$ are independently methyl or ethyl; and $R^{23}$ and $R^{24}$ are each hydrogen.

36. The composition of claim 24 wherein the squarylium compound is selected from the group consisting of:

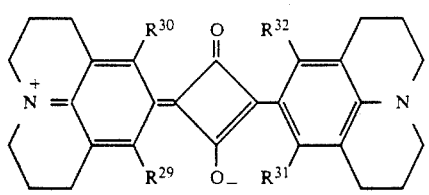

wherein

R$^{29}$, R$^{30}$, R$^{31}$, and R$^{32}$ are independently hydrogen, hydroxyl, or alkyl or alkoxyl of 1 to 6 carbon atoms.

37. The composition of claim 36 wherein which R$^{29}$ and R$^{31}$ are hydrogen and R$^{30}$ and R$^{32}$ are hydrogen or hydroxyl.

38. The composition of claim 24 wherein the squarylium compound is selected from the group consisting of:

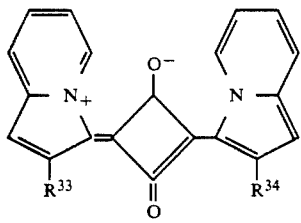

wherein

R$^{33}$ and R$^{34}$ are each independently hydrogen, halogen, substituted or unsubstituted, alkyl. alkoxyl, or substituted or unsubstituted aryl or heteroaryl group having from 5 to 10 atoms.

39. The composition of claim 38 wherein R$^{33}$ and R$^{34}$ are hydrogen, alkyl, or substituted or unsubstituted aryl or heteroaryl group having from 5 to 6 atoms.

40. The composition of claim 39 wherein R$^{33}$ and R$^{34}$ are methyl or p-methoxyphenyl.

41. The composition of claim 24 wherein the squarylium compound is selected from the group consisting of:

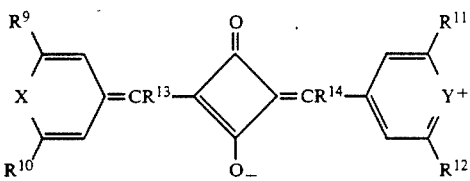

wherein

X and Y are each independently oxygen or sulfur and R$^9$, R$^{10}$, R$^{11}$, R$^{12}$, R$^{13}$, and R$^{14}$ are each independently hydrogen or an alkyl group having from one to eight carbon atoms.

42. The composition of claim 41 wherein R$^9$, R$^{10}$, R$^{11}$, and R$^{12}$ are each t-butyl and R$^{13}$ and R$^{14}$ are hydrogen.

* * * * *